US012795832B2

(12) United States Patent
Liu et al.

(10) Patent No.: US 12,795,832 B2
(45) Date of Patent: Nov. 10, 2026

(54) WIRING BOARD AND MANUFACTURING METHOD THEREOF, AND FUNCTIONAL BACKPLANE

(71) Applicants: BOE MLED Technology Co., Ltd., Beijing (CN); BOE TECHNOLOGY GROUP CO., LTD., Beijing (CN)

(72) Inventors: Chao Liu, Beijing (CN); Ting Cai, Beijing (CN); Ming Zhai, Beijing (CN); Lili Wang, Beijing (CN); Jing Wang, Beijing (CN); Mingming Jia, Beijing (CN); Sha Feng, Beijing (CN); Enkai Dong, Beijing (CN); Haiwei Sun, Beijing (CN); Ke Wang, Beijing (CN)

(73) Assignees: BOE MLED TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 535 days.

(21) Appl. No.: 18/043,219

(22) PCT Filed: Feb. 21, 2022

(86) PCT No.: PCT/CN2022/077130
§ 371 (c)(1),
(2) Date: Feb. 27, 2023

(87) PCT Pub. No.: WO2023/155199
PCT Pub. Date: Aug. 24, 2023

(65) Prior Publication Data

US 2025/0040049 A1 Jan. 30, 2025

(51) Int. Cl.
*H05K 1/14* (2006.01)
*H05K 1/02* (2006.01)
(Continued)

(52) U.S. Cl.
CPC ........... *H05K 1/144* (2013.01); *H05K 1/0296* (2013.01); *H05K 1/117* (2013.01); *H05K 3/36* (2013.01);
(Continued)

(58) Field of Classification Search
CPC .............. H05K 2201/041; H05K 2201/10765; H05K 2201/10757; H05K 2201/10378; H05K 2201/0311; H05K 1/141; H05K 1/144
See application file for complete search history.

(56) References Cited

U.S. PATENT DOCUMENTS 3,221,286 A * 11/1965 Feede .................... H01R 12/73 333/260
6,025,901 A * 2/2000 Adachi .............. G02F 1/13452 349/158
(Continued)

FOREIGN PATENT DOCUMENTS

CN 101128091 A 2/2008
CN 101502189 A 8/2009
(Continued)

OTHER PUBLICATIONS

Rejection decision on the Chinese Patent Application No. 201810960302.1 issued by the Chinese Patent Office on Mar. 4, 2021.
(Continued)

*Primary Examiner* — Paresh Paghadal
(74) *Attorney, Agent, or Firm* — XSENSUS LLP

(57) ABSTRACT

A wiring board assembly includes a mother board and a daughter board that are stacked, a bonding layer disposed between the mother board and the daughter board, and at least one side wiring. The mother board includes a first substrate, and a first wiring layer disposed on the first substrate and including at least one first connection pad. The
(Continued)

daughter board is disposed on a side of the first substrate away from the first wiring layer. The daughter board includes a second substrate, and a second wiring layer disposed on the second substrate and including at least one second connection pad. The at least one side wiring is connected, via a respective end thereof, to the at least one first connection pad in one-to-one correspondence, and the at least one side wiring is connected, via respective another end thereof, to the at least one second connection pad in one-to-one correspondence.

20 Claims, 10 Drawing Sheets

(51) Int. Cl.

| | |
|---|---|
| ***H05K 1/11*** | (2006.01) |
| ***H05K 3/36*** | (2006.01) |
| ***H10W 70/05*** | (2026.01) |
| ***H10W 70/60*** | (2026.01) |
| ***H10W 70/65*** | (2026.01) |
| ***H10W 90/00*** | (2026.01) |

(52) U.S. Cl.

CPC .......... *H10W 70/05* (2026.01); *H10W 70/611* (2026.01); *H10W 70/65* (2026.01); *H10W 90/401* (2026.01); *H05K 2201/041* (2013.01); *H10W 90/00* (2026.01)

(56) References Cited

U.S. PATENT DOCUMENTS

| | | | | |
|---|---|---|---|---|
| 2002/0149074 | A1 | 10/2002 | Imaeda | |
| 2007/0029663 | A1 | 2/2007 | Kim et al. | |
| 2007/0034402 | A1* | 2/2007 | Cheng | G02F 1/13452 174/268 |
| 2008/0041619 | A1 | 2/2008 | Lee et al. | |
| 2010/0097551 | A1 | 4/2010 | Yamagishi et al. | |
| 2010/0230147 | A1 | 9/2010 | Gokan et al. | |
| 2014/0332258 | A1* | 11/2014 | Uchida | H05K 1/116 174/262 |
| 2015/0366050 | A1* | 12/2015 | Noh | H05K 1/147 361/749 |
| 2018/0188579 | A1 | 7/2018 | Jeong et al. | |
| 2018/0263123 | A1 | 9/2018 | Chen et al. | |
| 2022/0208945 | A1* | 6/2022 | Lee | H10K 59/1315 |
| 2022/0384492 | A1* | 12/2022 | Lu | H10D 86/451 |
| 2023/0238494 | A1* | 7/2023 | Choi | H01L 25/0753 257/79 |

FOREIGN PATENT DOCUMENTS

| | | | |
|---|---|---|---|
| CN | 101636689 | A | 1/2010 |
| CN | 107065334 | A | 8/2017 |
| CN | 108231852 | A | 6/2018 |
| CN | 108267903 | A | 7/2018 |
| CN | 113383241 | A | 9/2021 |
| CN | 113793859 | A | 12/2021 |
| JP | 2017183684 | A | 10/2017 |

OTHER PUBLICATIONS

International Search Report and Written Opinion on the International Patent Application No. PCT/CN2019/088779 issued by the International Searching Authority on Sep. 2, 2019.

Non-final office action issued on the U.S. Appl. No. 16/753,955 issued by the USPTO on May 4, 2022.

Notice of Allowance issued for the U.S. Appl. No. 16/753,955 issued by the USPTO on Aug. 19, 2022.

First Office Action on the Chinese Patent Application No. 201810960302.1 issued by the Chinese Patent Office on Dec. 2, 2019.

Second Office Action on the Chinese Patent Application No. 201810960302.1 issued by the Chinese Patent Office.

First Office Action mailed on Jun. 18, 2026, received for CN Application 202280000233.4, 14 pages including English Translation.

* cited by examiner

WIRING BOARD AND MANUFACTURING METHOD THEREOF, AND FUNCTIONAL BACKPLANE

CROSS-REFERENCE TO RELATED APPLICATION

This application is a national phase entry under 35 USC 371 of International Patent Application No. PCT/CN 2022/077130 filed on Feb. 21, 2022, which is incorporated herein by reference in its entirety.

TECHNICAL FIELD

The present disclosure relates to the field of lighting and display technologies, and in particular, to a wiring board assembly and a manufacturing method thereof, and a functional backplane.

BACKGROUND

Compared with an organic light-emitting diode (OLED) light-emitting device, in a light-emitting diode (LED), an inorganic semiconductor material is used to manufacture a PN junction, and carriers are combined in the PN junction to realize light emission under a drive of an electric field, so that a light-emitting brightness and a response speed are higher.

SUMMARY

In an aspect, a wiring board assembly is provided. The wiring board assembly includes a mother board and a daughter board that are stacked, a bonding layer disposed between the mother board and the daughter board, and at least one side wiring. The mother board includes a first substrate and a first wiring layer disposed on the first substrate, and the first wiring layer includes at least one first connection pad. The daughter board is disposed on a side of the first substrate away from the first wiring layer.

The daughter board includes a second substrate and a second wiring layer disposed on the second substrate, and the second wiring layer includes at least one second connection pad. The at least one side wiring is connected, via a respective end thereof, to the at least one first connection pad in one-to-one correspondence, and the at least one side wiring is connected, via respective another end thereof, to the at least one second connection pad in one-to-one correspondence.

In some embodiments, the second wiring layer is disposed on a side of the second substrate proximate to the mother board. At least one first via is disposed in the second substrate, and each first via exposes a portion of the second wiring layer that constitutes a second connection pad in the at least one second connection pad. Alternatively, the second wiring layer includes a first sub-layer and a second sub-layer that are respectively disposed on two opposite sides of the second substrate in a thickness direction of the second substrate, and the first sub-layer is closer to the mother board than the second sub-layer. The second sub-layer includes the at least one second connection pad. At least one second via is disposed in the second substrate, and a second connection pad in the at least one second connection pad is electrically connected to the first sub-layer through a second via in the at least one second via. Alternatively, the second wiring layer is disposed on a side of the second substrate away from the mother board. The daughter board further includes an insulating layer disposed on a side of the second wiring layer away from the second substrate. At least one sixth via is disposed in the insulating layer, and each sixth via exposes a portion of the second wiring layer that constitutes a second connection pad in the at least one second connection pad.

In some embodiments, in a case where the second wiring layer includes the first sub-layer and the second sub-layer, an orthographic projection of edges of each second connection pad on the second substrate exceeds an orthographic projection, on the second substrate, of an edge of a corresponding second via proximate to this second connection pad.

In some embodiments, a distance between the orthographic projection of the edges of each second connection pad on the second substrate and the orthographic projection of the edge of the corresponding second via on the second substrate is in a range of 10 microns to 30 microns, inclusive.

In some embodiments, the second wiring layer further includes at least one fan-out wiring and at least one third connection pad. The at least one fan-out wiring is connected, via a respective end thereof, to the at least one third connection pad in one-to-one correspondence, and the at least one fan-out wiring is connected, via respective another end thereof, to the at least one second connection pad in one-to-one correspondence.

In some embodiments, in a case where the second wiring layer is disposed on the side of the second substrate proximate to the mother board, the at least one first via is disposed in the second substrate, and each first via exposes the portion of the second wiring layer that constitutes the second connection pad, the second wiring layer includes the at least one fan-out wiring. At least one third via is further disposed in the second substrate, and each third via exposes a portion of the second wiring layer that constitutes a third connection pad in the at least one third connection pad. The at least one first via is in one-to-one correspondence with the at least one third via, and a first via in the at least one first via and a corresponding third via in the at least one third via are located on a same fan-out wiring. In a case where the second wiring layer includes the first sub-layer and the second sub-layer, and the at least one second via is disposed in the second substrate, the first sub-layer includes the at least one fan-out wiring. The second sub-layer further includes the at least one third connection pad. At least one fourth via is further disposed in the second substrate, and each third connection pad is connected to a fan-out wiring in the at least one fan-out wiring through a fourth via in the at least one fourth via. The at least one fourth via is in one-to-one correspondence with the at least one second via, and a fourth via in the at least one fourth via and a corresponding second via in the at least one second via are located on a same fan-out wiring. In a case where the second wiring layer is disposed on the side of the second substrate away from the mother board, the daughter board further includes the insulating layer disposed on the side of the second wiring layer away from the second substrate, and the at least one sixth via is disposed in the insulating layer, the second wiring layer includes the at least one fan-out wiring. At least one fifth via is further disposed in the insulating layer, and each fifth via exposes a portion of the second wiring layer that constitutes a third connection pad in the at least one third connection pad. The at least one fifth via is in one-to-one correspondence with the at least one sixth via, and a fifth via in the at least one fifth via and a corresponding sixth via in the at least one sixth via are located on a same fan-out wiring.

In some embodiments, the mother board has an active area and a passive area located on a side of the active area.

The at least one first connection pad is disposed in the passive area, the daughter board is arranged close to the passive area, and an orthographic projection of the daughter board on the first substrate does not exceed edges of the first substrate.

In some embodiments, the mother board has a shape of a rectangle. The active area and the passive area are arranged in sequence in a first direction, and the first direction is a direction represented by a long side or a short side of the rectangle. In a case where the first direction is the direction represented by the long side of the rectangle, the at least one side wiring is disposed on a side of the wiring board assembly corresponding to the short side of the rectangle. In a case where the first direction is the direction represented by the short side of the rectangle, the at least one side wiring is disposed on a side of the wiring board assembly corresponding to the long side of the rectangle.

In some embodiments, the at least one second connection pad is arranged close to the passive area; and the at least one first connection pad includes a plurality of first connection pads, and the at least one second connection pad includes a plurality of second connection pads. The plurality of first connection pads are arranged in sequence in a second direction, and the plurality of second connection pads are arranged in sequence in the second direction. Each first connection pad is in correspondence with a second connection pad in the plurality of second connection pads connected to this first connection pad in a thickness direction of the second substrate. The second direction is perpendicular to the first direction.

In some embodiments, the wiring board assembly further includes a protective layer disposed on the at least one side wiring, and an orthographic projection of edges of the protective layer on the first substrate exceeds an orthographic projection of edges of the at least one side wiring on the first substrate.

In some embodiments, a distance between an edge of the protective layer and a corresponding edge of an entirety of the at least one side wiring is greater than or equal to 20 microns.

In some embodiments, in a case where the active area and the passive area are arranged in sequence in the first direction, and the first direction is the direction represented by the long side of the rectangle, there is a first gap between an orthographic projection, on the first substrate, of an edge of the daughter board proximate to the passive area and an edge of the first substrate corresponding to the short side of the rectangle and the edge of the daughter board. The wiring board assembly further includes a first level difference filling layer, and the first level difference filling layer is disposed between the daughter board and the at least one side wiring, and is located in the first gap. In a case where the active area and the passive area are arranged in sequence in the first direction, and the first direction is the direction represented by the short side of the rectangle, there is a second gap between the orthographic projection, on the first substrate, of the edge of the daughter board proximate to the passive area and an edge of the first substrate corresponding to the long side of the rectangle and the edge of the daughter board. The wiring board assembly further includes a second level difference filling layer, and the second level difference filling layer is disposed between the daughter board and the at least one side wiring, and is located in the second gap.

In some embodiments, in a case where the wiring board assembly includes the first level difference filling layer, a surface of the first level difference filling layer opposite to the side of the wiring board assembly where the at least one side wiring is located is an arc-shaped surface; in a case where the wiring board assembly includes the second level difference filling layer, a surface of the second level difference filling layer opposite to the side of the wiring board assembly where the at least one side wiring is located is an arc-shaped surface.

In some embodiments, a chamfer structure or a rounded corner structure is disposed at a position of the first substrate corresponding to a side of the wiring board assembly where the at least one side wiring is located.

In some embodiments, a thickness of the bonding layer is in a range of 8 microns to 15 microns, inclusive, and a thickness of the second substrate is in a range of 5 microns to 20 microns, inclusive.

In some embodiments, in a case where the second wiring layer is disposed on the side of the second substrate proximate to the mother board, or is disposed on the side of the second substrate away from the mother board, a thickness of the second wiring layer is in a range of 0.6 microns to 2 microns, inclusive. In a case where the second wiring layer includes the first sub-layer and the second sub-layer, a thickness of the first sub-layer and a thickness of the second sub-layer are each in a range of 0.6 microns to 2 microns, inclusive.

In another aspect, a functional backplane is provided. The functional backplane includes the above wiring board assembly and at least one electronic element. The at least one electronic element is disposed on the wiring board assembly, and is electrically connected to the first wiring layer in the wiring board assembly.

In yet another aspect, a manufacturing method of a wiring board assembly is provided. The manufacturing method of the wiring board assembly includes following steps.

A mother board and a daughter board are manufactured separately. The mother board includes a first substrate and a first wiring layer formed on the first substrate, and the first wiring layer includes at least one first connection pad. The daughter board includes a second substrate and a second wiring layer formed on the second substrate, and the second wiring layer includes at least one second connection pad.

A bonding layer is formed between the mother board and the daughter board to connect the mother board and the daughter board. The daughter board is formed on a side of the first substrate away from the first wiring layer.

At least one side wiring is formed on the mother board and the daughter board. The at least one side wiring is connected, via a respective end thereof, to the at least one first connection pad in one-to-one correspondence, and the at least one side wiring is connected, via respective another end thereof, to the at least one second connection pad in one-to-one correspondence.

In some embodiments, the second substrate is a flexible substrate.

Manufacturing the daughter board, includes following steps.

A sacrificial layer is formed on a third substrate.

The at least one second connection pad is formed on the third substrate on which the sacrificial layer is formed.

A flexible film is formed on the third substrate on which the at least one second connection pad is formed, and at least one second via is formed in the flexible film. Each second via corresponds to a second connection pad in the at least one second connection pad.

A third wiring layer is formed on the third substrate on which the at least one second via is formed. Each second connection pad is electrically connected to the third wiring layer through a second via in the at least one second via.

The sacrificial layer is heated or irradiated with light to separate the second substrate and the at least one second connection pad from the third substrate, so as to obtain the daughter board.

In some embodiments, the second substrate is a rigid substrate. Manufacturing the daughter board, includes a following step.

The second wiring layer is directly formed on the second substrate to obtain the daughter board.

In some embodiments, a material of the bonding layer includes an adhesive.

Before the sacrificial layer is heated or irradiated with light to separate the second substrate and the at least one second connection pad from the third substrate, manufacturing the daughter board further includes: sequentially forming a glue layer and a release layer on the third substrate on which the third wiring layer is formed. After the sacrificial layer is heated or irradiated with light to separate the second substrate and the at least one second connection pad from the third substrate, the manufacturing method of the wiring board assembly further includes: removing the release layer to expose the glue layer, so as to adhere the mother board to the daughter board by using the glue layer.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on an actual size of a product, an actual process of a method and an actual timing of a signal involved in the embodiments of the present disclosure.

DETAILED DESCRIPTION

Figure 1A:
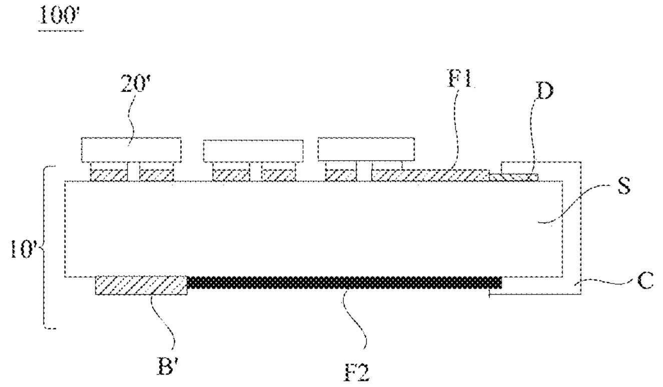
FIG. 1A (PRIOR ART)
FIG. 1A is a sectional view of a functional backplane in the related art.

Technical solutions in some embodiments of the present disclosure will be described clearly and completely below with reference to the accompanying drawings.

Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment," "some embodiments," "exemplary embodiments," "an example," "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are only used for descriptive purposes, and are not to be construed as indicating or implying relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

The phrase "at least one of A, B and C" has the same meaning as the phrase "at least one of A, B or C", both including following combinations of A, B and C: only A, only B, only C, a combination of A and B, a combination of A and C, a combination of B and C, and a combination of A, B and C.

The phrase "A and/or B" includes following three combinations: only A, only B, and a combination of A and B.

The use of the phase "applicable to" or "configured to" herein means an open and inclusive expression, which does not exclude devices that are applicable to or configured to perform additional tasks or steps.

Some embodiments of the present disclosure provide a light-emitting apparatus. The light-emitting apparatus includes a functional backplane. Of course, the light-emitting apparatus may further include other components, such as a circuit for providing electrical signals to the functional backplane to drive the functional backplane to emit light. The circuit may be referred to as a control circuit, and may include a circuit board and/or an integrated circuit (IC) electrically connected to the functional backplane.

In some embodiments, the light-emitting apparatus may be a lighting apparatus, and in this case, the light-emitting apparatus is used as a light source to realize a lighting function. For example, the light-emitting apparatus may be a backlight module in a liquid crystal display apparatus, a lamp for internal or external lighting, or a signal lamp.

In some other embodiments, the light-emitting apparatus may be a display apparatus, and in this case, the functional backplane is a display substrate for realizing a function of displaying an image (i.e., picture). The light-emitting apparatus may include a display or a product including a display. The display may be a flat panel display (FPD), or a micro-display. The display may be a transparent display or an opaque display, depending on whether a user can see a scene behind the display. The display may be a flexible display or a normal display (which may be referred to as a rigid display), depending on whether the display is bendable or rollable. For example, the product including the display may be a computer display, a television, a billboard, a laser printer with a display function, a telephone, a mobile phone, a personal digital assistant (PDA), a laptop computer, a digital camera, a camcorder, a viewfinder, a vehicle, a large area wall screen, a theater screen, or a stadium sign.

Some embodiments of the present disclosure provide the functional backplane. As shown in FIG. 1D, the functional backplane 100 includes a wiring board assembly 10 and at least one electronic element 20 disposed on the wiring board assembly 10. The electronic element 20 may be a micro light-emitting diode, a micro integrated circuit chip, a micro sensor, or a micro driver, which is not limited here.

In some embodiments, in an example where the electronic element 20 is the micro light-emitting diode, the functional backplane 100 may be used as a backlight source or a display apparatus. In a case where the functional backplane 100 is used as the backlight source, a passive display panel (e.g., a liquid crystal display panel) may be matched with the functional backplane 100 to display a full color picture. In this case, the functional backplane 100 may integrally emit monochromatic light or polychromatic light (e.g., white light), and by arranging a plurality of micro light-emitting diodes in a matrix and combining a local dimming technology, a fine brightness control and a high color contrast may be achieved. In a case where the functional backplane 100 is used as the display apparatus, the functional backplane 100 may be provided with micro light-emitting diodes capable of emitting light of different colors, which cooperate with each other to display a full color picture, so that the functional backplane 100 may have a high brightness and a high contrast.

At present, considering a process yield and a manufacturing cost, when a large-size product is manufactured, a plurality of functional backplanes may be spliced. In order to avoid influencing a user experience due to a split feeling possibly generated by splicing between adjacent functional backplanes, a functional backplane is designed to have an ultra-narrow bezel or even have no bezel to achieve a seamless splicing effect. This method is a development direction in the field.

Figure 1B:
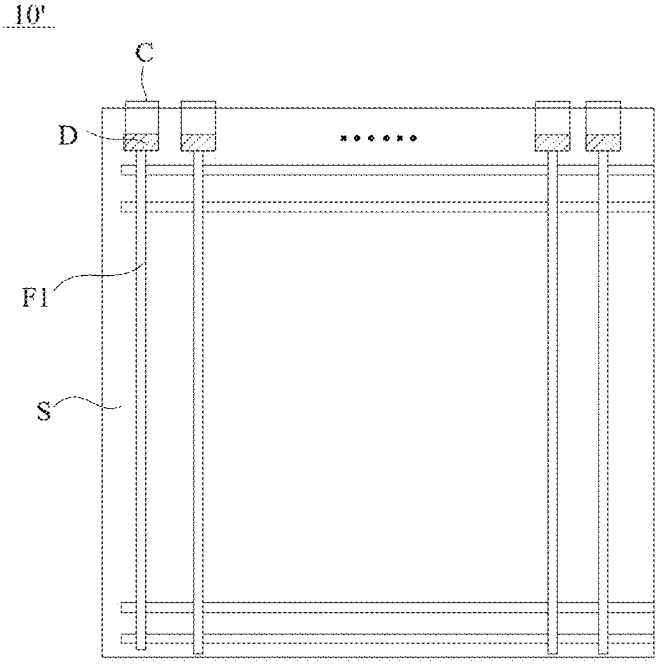
FIG. 1B (PRIOR ART)
FIG. 1B is a front plan view of a wiring board in the related art.
Figure 1C:
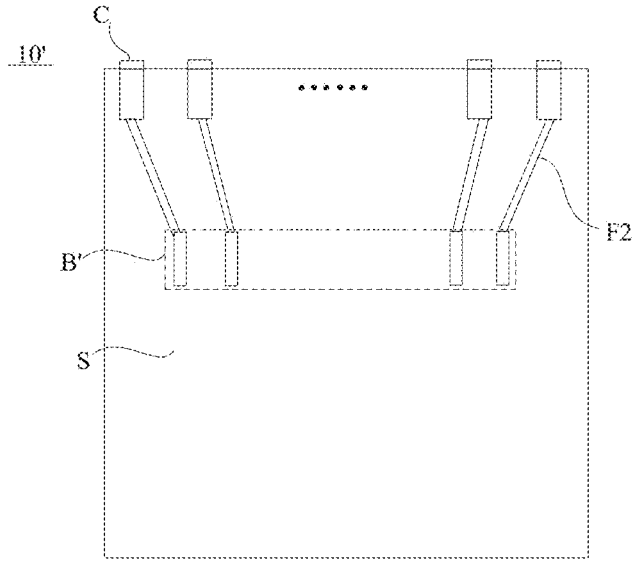
FIG. 1C (PRIOR ART)
FIG. 1C is a rear plan view of a wiring board in the related art.
Figure 1D:
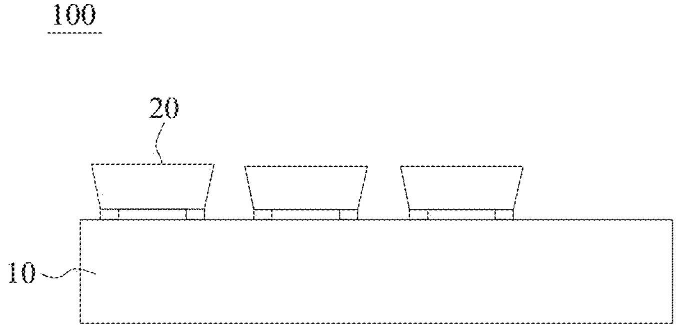
FIG. 1D is a sectional view of a functional backplane, in accordance with some embodiments.

In order to realize an ultra-narrow bezel display, as shown in FIGS. 1A, 1B and 1C, two opposite surfaces of a substrate S of a wiring board 10' of a functional backplane 100' in the related art are each provided with wiring(s) thereon. A first surface of the substrate S is provided with wiring(s) F1 respectively connected to electronic element(s) 20'. The wiring(s) F1 each have a leading-out portion D that is led to a second surface of the substrate S through a side wiring C, and are respectively electrically connected to wiring(s) F2 (e.g., at least one fan-out wiring) disposed on the second surface of the substrate S of the wiring board 10'. For example, a bonding area B' is manufactured on the second surface of the substrate S of the wiring board 10', so as to realize a narrow bezel design. However, the two surfaces of the substrate S are each provided with the wiring(s), and wiring(s) on one of the surfaces are easily scratched in a manufacturing process, which is not conducive to ensuring a product yield, resulting in a high production cost.

Figure 2A:
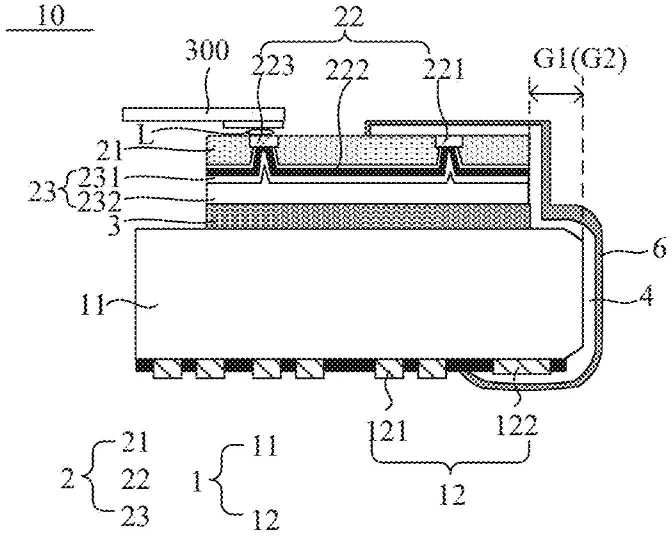
FIG. 2A is a sectional view of a wiring board assembly, in accordance with some embodiments.

Based on this, some embodiments of the present disclosure provide the wiring board assembly 10. As shown in FIG. 2A, the wiring board assembly 10 includes a mother board 1 and a daughter board 2 that are stacked, and a bonding layer 3 disposed between the mother board 1 and the daughter board 2.

Figure 2B:
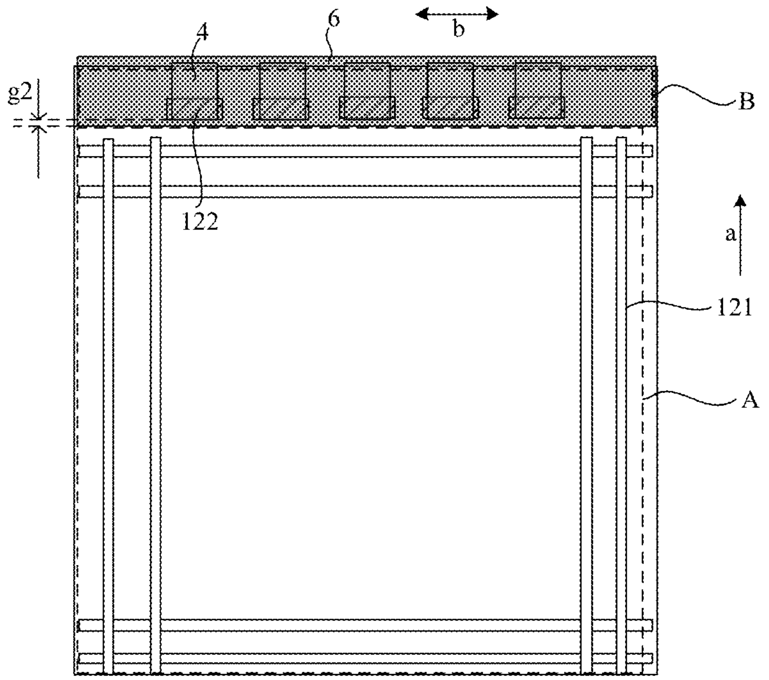
FIG. 2B is a front plan view of a wiring board assembly, in accordance with some embodiments.
Figure 2C:
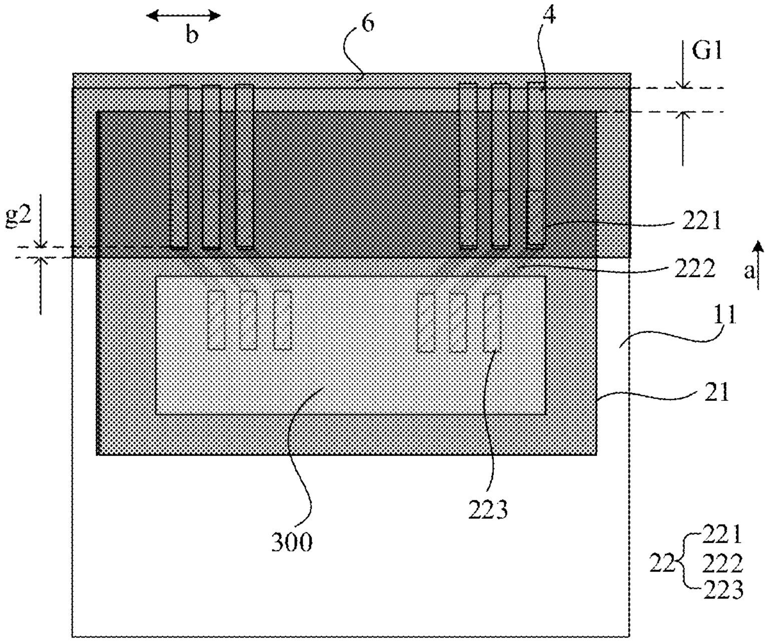
FIG. 2C is a rear plan view of a wiring board assembly, in accordance with some embodiments.

The mother board 1 includes a first substrate 11 and a first wiring layer 12 disposed on the first substrate 11. The first wiring layer 12 includes driving element(s) 121 connected to the electronic element(s) 20, and at least one first connection pad 122. As shown in FIG. 2B, in an example where the wiring board assembly 10 has an active area A and a passive area B disposed on a side of the active area A, at least the electronic element(s) and the driving element(s) 121 are disposed in the active area A, at least the at least one first connection pad 122 is disposed in the passive area B, and the at least one first connection pad 122 is electrically connected to the driving element(s) 121 for transmitting electrical signal(s) to the driving element(s) 121. The driving element may include a micro integrated circuit chip or a driving circuit composed of several thin film transistors connected with each other. As shown in FIGS. 2A and 2C, the daughter board 2 is disposed on a side of the first substrate 11 away from the first wiring layer 12. The daughter board 2 includes a second substrate 21 and a second wiring layer 22 disposed on the second substrate 21. The second wiring layer 22 includes at least one second connection pad 221.

In some embodiments, as shown in FIGS. 2A, 2B and 2C, the wiring board assembly 10 further includes at least one side wiring 4. The at least one side wiring 4 is connected, via its respective end, to the at least one first connection pad 122 in one-to-one correspondence, and the at least one side wiring 4 is connected, via its respective another end, to the at least one second connection pad 221 in one-to-one correspondence.

In these embodiments, the at least one first connection pad 122 is connected to the at least one second connection pad 221 in one-to-one correspondence through the at least one side wiring 4. That is, the at least one second connection pad 221 may transmit driving signal(s) to the at least one first connection pad 122, thereby transmitting the driving signal(s) to the driving element(s) 121.

The bonding layer 3 is a film layer that is disposed between the mother board 1 and the daughter board 2 and is capable of being bonded to the mother board 1 and the daughter board 2. For example, in some embodiments, the bonding layer 3 may be made of, an adhesive glue or an adhesive.

In the embodiments of the present disclosure, by providing the first substrate 11 and the second substrate 21, the first wiring layer 12 may be manufactured on the first substrate 11, and the second wiring layer 22 may be manufactured on the second substrate 21, so that the scratching problem may be avoided to ensure and improve the manufacturing yield, thereby reducing the production cost, compared with the related art in which the wiring(s) are directly disposed on the two opposite surfaces of the substrate S (e.g., the first substrate 11) of the wiring board 10' as shown in FIGS. 1A and 1B.

A structure and an arrangement of the second wiring layer 22 are not specifically limited.

In some embodiments, the second wiring layer 22 may be have single-layer structure or a multi-layer structure. In a case where the second wiring layer 22 has the single-layer structure, the second wiring layer 22 may be disposed on a side of the second substrate 21 proximate to the mother board 1, or disposed on a side of the second substrate 21 away from the mother board 1; in a case where the second wiring layer 22 has the multi-layer structure, the multi-layer structure may be disposed on the side of the second substrate 21 proximate to the mother board 1, or disposed on the side of the second substrate 21 away from the mother board 1, which is not specifically limited here.

Figure 3A:
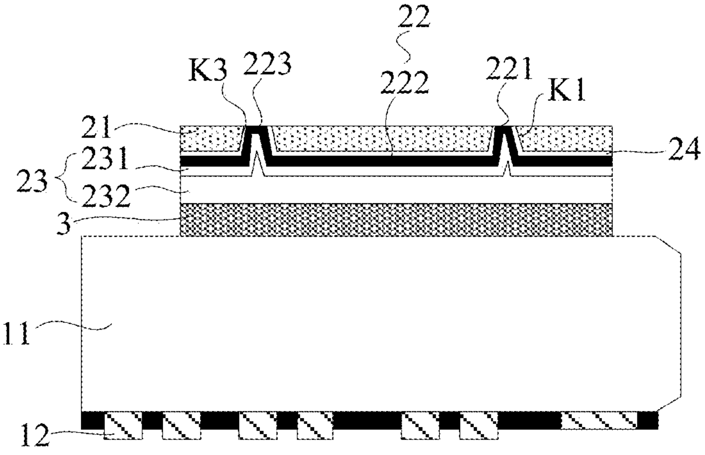
FIG. 3A is a sectional view of another wiring board assembly, in accordance with some embodiments.

In some embodiments, as shown in FIG. 3A, the second wiring layer 22 is disposed on the side of the second substrate 21 proximate to the mother board. At least one first via K1 is provided in the second substrate 21, and each first via K1 exposes a portion of the second wiring layer 22 that constitutes a second connection pad 221.

In these embodiments, since the second wiring layer 22 is disposed on the side of the second substrate 21 proximate to the mother board 1, the second wiring layer 22 may be hidden under the second substrate 21, so that the second wiring layer 22 may be further prevented from being scratched.

A material of the second substrate 21 may be selected from organic materials such as polyimide and polymethyl methacrylate.

During manufacturing, a sacrificial layer, the second wiring layer 22 and the second substrate 21 may be sequentially formed on a rigid substrate. In a case where the second wiring layer 22 has a strong adhesion to the second substrate 21, the second substrate 21 on which the second wiring layer 22 is formed may be obtained by peeling.

In order to increase the adhesion of the second wiring layer 22 to the second substrate 21, the mother board further includes a buffer layer 24 disposed between the second wiring layer 22 and the second substrate 21. The buffer layer 24 may be made of silicon oxide (e.g., SiO), silicon nitride (e.g., SiN), or silicon oxynitride (e.g., SiON). In addition to increasing the adhesion of the second wiring layer 22 to the second substrate 21, the buffer layer 24 may function to isolate water and oxygen.

Figure 3B:
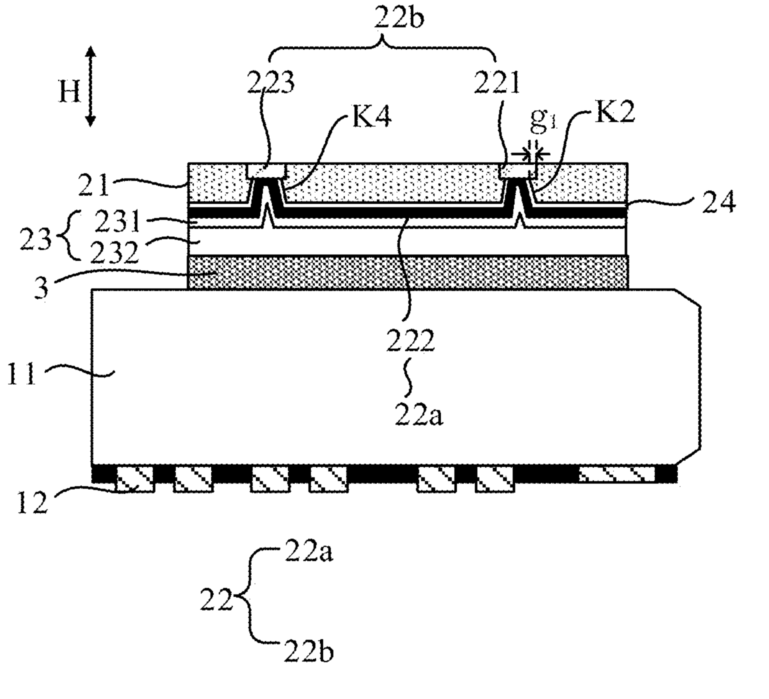
FIG. 3B is a sectional view of yet another wiring board assembly, in accordance with some embodiments.

In some other embodiments, as shown in FIG. 3B, the second wiring layer 22 includes a first sub-layer 22*a* and a second sub-layer 22*b* that are respectively disposed on two opposite sides of the second substrate 21 in a thickness direction H of the second substrate 21, and the first sub-layer 22*a* is closer to the mother board than the second sub-layer 22*b*. The second sub-layer 22*b* includes the at least one second connection pad 221. At least one second via K2 is provided in the second substrate 21, and a second connection pad 221 is electrically connected to the first sub-layer 22*a* through a second via K2.

In these embodiments, the second wiring layer 22 has the multi-layer structure, and the second via(s) K2 are disposed in the second substrate 21, so that the first sub-layer 22*a* is electrically connected to the second connection pad(s) 221. Moreover, in these embodiments, the first sub-layer 22*a* may have the same structure as that of the second wiring layer 22 with the single-layer structure, and the first sub-layer 22*a* may also be disposed on the side of the second substrate 21 towards the mother board, so that the second wiring layer 22 is able to be further prevented from being scratched.

It will be noted that unlike the second wiring layer 22 disposed on the side of the second substrate 21 proximate to the mother board, the second wiring layer 22 includes the first sub-layer 22*a* and the second sub-layer 22*b*, the first sub-layer 22*a* is located on the side of the second substrate 21 proximate to the mother board, and the second sub-layer 22*b* is located on the side of the second substrate 21 away from the mother board.

Based on this, in some embodiments, as shown in FIG. 3B, an orthographic projection of edges of each second connection pad 221 on the second substrate 21 exceeds an orthographic projection, on the second substrate 21, of an edge of a corresponding second via K2 proximate to this second connection pad 221.

In these embodiments, a contact area of the second connection pad 221 and the second substrate 21 may be increased, so that the second connection pad 221 is able to be prevented from falling off.

A material of the second substrate 21 may be selected from organic materials such as polyimide and polymethyl methacrylate.

During manufacturing, a sacrificial layer, the second sub-layer 22*b*, the second substrate 21 and the first sub-layer 22*a* may be sequentially formed on a rigid substrate. Then, the second substrate 21 on which the second wiring layer 22 is formed may be obtained by peeling.

In this process, since the orthographic projection of the edges of each second connection pad 221 on the second substrate 21 exceeds the orthographic projection, on the second substrate 21, of the edge of the corresponding second via K2 proximate to this second connection pad 221, the subsequent peeling is facilitated by increasing the contact area of the second connection pad 221 and the second substrate.

For example, in some embodiments, as shown in FIG. 3B, a distance g1 between the orthographic projection of the edges of each second connection pad 221 on the second substrate 21 and the orthographic projection, on the second substrate 21, of the edge of the corresponding second via K2 is in a range of 10 microns to 30 microns, inclusive.

In these embodiments, by limiting the distance g1 between the orthographic projection of the edges of each second connection pad 221 on the second substrate 21 and the orthographic projection, on the second substrate 21, of the edge of the corresponding second via K2 to the range of 10 microns and 30 microns, a success rate of the peeling may be improved to a maximum extent while ensuring a small coverage area of the second sub-layer 22*b*.

In some embodiments, as shown in FIG. 3B, the daughter board further includes an insulating layer 23 disposed between the bonding layer 3 and the first sub-layer 22*a*. The insulating layer 23 may include an inorganic insulating layer 231 and an organic insulating layer 232 arranged in sequence in a direction towards the bonding layer 3. The inorganic insulating layer 231 may be made of silicon oxide (e.g., SiO), silicon nitride (e.g., SiN) or silicon oxynitride (e.g., SiON), and the inorganic insulating layer 231 may function to isolate water and oxygen. The organic insulating layer 232 may be made of a resin material (e.g., epoxy resin), and the organic insulating layer 232 may have a planarization function.

In order to increase the adhesion of the first sub-layer 22*a* to the second substrate 21, the daughter board further includes a buffer layer 24 disposed between the first sub-layer 22*a* and the second substrate 21. The buffer layer 24 may be made of silicon oxide (e.g., SiO), silicon nitride (e.g., SiN), or silicon oxynitride (e.g., SiON). In addition to increasing the adhesion of the first sub-layer 22*a* to the second substrate 21, the buffer layer 24 may function to isolate water and oxygen.

Figure 3C:
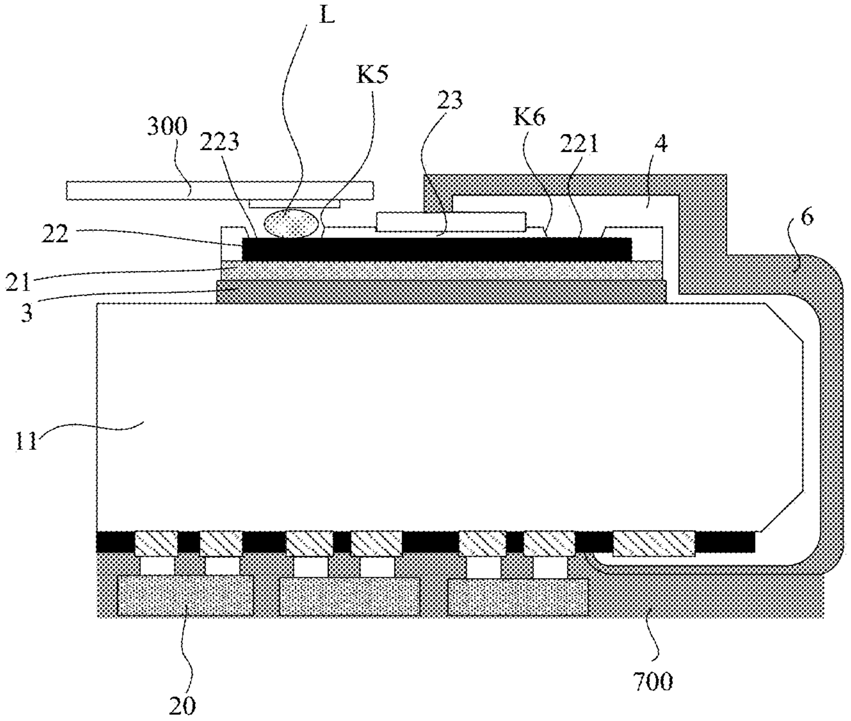
FIG. 3C is a sectional view of yet another wiring board assembly, in accordance with some embodiments.

In yet other embodiments, as shown in FIG. 3C, the second wiring layer 22 is disposed on the side of the second substrate 21 away from the mother board. The daughter board 2 further includes an insulating layer 23 disposed on a side of the second wiring layer 22 away from the second substrate 21. At least one sixth via K6 is provided in the insulating layer 23, and each sixth via K6 exposes a portion of the second wiring layer 22 that constitutes a second connection pad 221.

In these embodiments, the second wiring layer 22 may be hidden under the insulating layer 23, so that the second wiring layer 22 is also able to be prevented from being scratched.

The insulating layer 23 may include an inorganic insulating layer and an organic insulating layer stacked in sequence in a direction away from the mother board 1.

The inorganic insulating layer may be made of silicon oxide (e.g., SiO), silicon nitride (e.g., SiN), or silicon oxynitride (e.g., SiON), and the inorganic insulating layer may function to isolate water and oxygen. The organic insulating layer may be made of a resin material (e.g., epoxy resin), and the organic insulating layer may have a planarization function.

In some embodiments, the second substrate 21 may be a rigid substrate, such as a glass substrate. In this case, the second wiring layer 22 and the insulating layer 23 may be directly formed on the glass substrate obtain the daughter board. Then, the bonding layer 3 may be used to connect the mother board and the daughter board, thereby obtaining the wiring board assembly.

In some other embodiments, a sacrificial layer, the second substrate 21, the second wiring layer 22 and the insulating layer 23 are sequentially formed on the rigid substrate. Then, the second substrate 21 on which the second wiring layer 22 is formed may be obtained by peeling the second substrate from the rigid substrate. In this case, the bonding layer 3 may be formed on a side of the second substrate 21 away from the second wiring layer 22, so that the second substrate 21 is connected to the mother board by the bonding layer 3.

In these embodiments, unlike the second substrate 21 which is the rigid substrate and on which the second wiring layer 22 is directly formed, the daughter board may further include a buffer layer disposed between the second wiring layer 22 and the second substrate 21. A material and a function of the buffer layer may refer to the above description, and will not be repeated here.

In some embodiments, as shown in FIGS. 2A to 3C, the second wiring layer 22 further includes at least one fan-out wiring 222 and at least one third connection pad 223. The at least one fan-out wiring 222 is connected, via its respective end, to the at least one third connection pad 223 in one-to-one correspondence, and the at least one fan-out wiring 222 is connected, via its respective another end, to the at least one second connection pad 221 in one-to-one correspondence.

As shown in FIGS. 2A and 2C, the at least one third connection pad 223 may be electrically connected to the circuit board 300. The at least one third connection pad 223 is connected to the at least one second connection pad 221 in one-to-one correspondence through the at least one fan-out wiring 222, so that the circuit board 300 may transmit the driving signal(s) to the at least one second connection pad 221, so as to transmit the driving signal(s) to the driving element(s) 121.

As shown in FIGS. 2A and 2C, the circuit board 300 is bonded to the third connection pad(s) 223 through connection portion(s) L. The circuit board 300 is a printed circuit board, a flexible printed circuit, or an integrated circuit chip. The connection portion(s) L may be made of an anisotropic conductive film (ACF). Each gold finger of the circuit board 300 is firmly electrically connected to a third connection pad 223 through a connection portion L.

Structures of the at least one fan-out wiring 222 and the at least one third connection pad 223 are not specifically limited, as long as the at least one fan-out wiring 222 is connected, via its respective end, to the at least one third connection pad 223 in one-to-one correspondence, and the at least one fan-out wiring 222 is connected, via its respective another end, to the at least one second connection pad 221 in one-to-one correspondence.

In some embodiments, as shown in FIG. 3A, in a case where the second wiring layer 22 is disposed on the side of the second substrate 21 proximate to the mother board, the at least one first via K1 is disposed in the second substrate 21, and each first via K1 exposes the portion of the second wiring layer 22 that constitutes the second connection pad 221, the second wiring layer 22 includes the at least one fan-out wiring 222. At least one third via K3 is further provided in the second substrate 21, and each third via K3 exposes a portion of the second wiring layer 22 that constitutes a third connection pad 223. The first via(s) K1 are in one-to-one correspondence with the third via(s) K3, and a first via K1 and a corresponding third via K3 are located on a same fan-out wiring 222. In these embodiments, similar to the fact that the at least one first via K1 is disposed in the second substrate 21, the at least one third connection pad 223 may be formed by arranging the at least one third via K3 in the second substrate 21. Since the first via(s) K1 are in one-to-one correspondence with the third via(s) K3, and the first via K1 and the corresponding third via K3 are located on the same fan-out wiring 222, the at least one third connection pad 223 may be connected to the at least one second connection pad 221 in one-to-one correspondence through the at least one fan-out wiring 222.

In some other embodiments, as shown in FIG. 3B, in a case where the second wiring layer 22 includes the first sub-layer 22*a* and the second sub-layer 22*b*, and the at least one second via K2 is disposed in the second substrate 21, the first sub-layer 22*a* includes the at least one fan-out wiring 222, and the second sub-layer 22*b* includes the at least one third connection pad 223. At least one fourth via K4 is further provided in the second substrate 21, and each third connection pad 223 is connected to a fan-out wiring 222 through a fourth via K4. The fourth via(s) K4 are in one-to-one correspondence with the second via(s) K2, and a fourth via K4 and a corresponding second via K2 are located on a same fan-out wiring 222.

In these embodiments, similar to the fact that the at least one second via K2 is disposed in the second substrate 21, by arranging the at least one fourth via K4 in the second substrate 21, each third connection pad 223 is connected to a fan-out wiring 222 through a fourth via K4, the fourth via(s) K4 are in one-to-one correspondence with the second via(s) K2, and the fourth via K4 and the corresponding second via K2 are located on the same fan-out wiring 222. Moreover, each second connection pad 221 is connected to the first sub-layer 22*a* by a second via K2. Therefore, in a case where the first sub-layer 22*a* includes the at least one fan-out wiring 222, the at least one third connection pad 223 is connected to the at least one second connection pad 221 in one-to-one correspondence, and a third connection pad 223 is connected to a corresponding second connection pad 221 through a same fan-out wiring 222.

In yet other embodiments, as shown in FIG. 3C, in a case where the second wiring layer 22 is disposed on the side of the second substrate 21 away from the mother board, the daughter board further includes the insulating layer 23 disposed on the side of the second wiring layer 22 away from the second substrate 21, and the at least one sixth via K6 is disposed in the insulating layer 23, the second wiring layer 22 includes the at least one fan-out wiring 222. At least one fifth via K5 is further provided in the insulating layer 23, and each fifth via K5 exposes a portion of the second wiring layer 22 that constitutes a third connection pad 223. The fifth via(s) K5 are in one-to-one correspondence with the sixth via(s) K6, and a fifth via K5 and a corresponding sixth via K6 are located on a same fan-out wiring 222.

In these embodiments, similar to the case that the at least one sixth via K6 is disposed in the insulating layer 23, by arranging the at least one fifth via K5 in the insulating layer 23, each fifth via K5 exposes the portion of the second wiring layer 22 that constitutes the third connection pad 223, the fifth via(s) K5 are in one-to-one correspondence with the sixth via(s) K6, and the fifth via K5 and the corresponding sixth via K6 are located on the same fan-out wiring 222. Therefore, the third connection pad(s) 223 are in one-to-one correspondence with the second connection pad(s) 221, and a third connection pad 223 and a corresponding second connection pad 221 are located on a same fan-out wiring 222. That is, the second connection pad(s) 221 are electrically connected to the third connection pad(s) 223 in one-to-one correspondence, and a second connection pad 221 is electrically connected to a corresponding third connection pad 223 through a fan-out wiring 222.

A size and a position of the mother board 1, and a size and a position of the daughter board 2 are not specifically limited, as long as the mother board 1 and the daughter board 2 are stacked.

In some embodiments, as shown in FIGS. 2B and 2C, the size of the daughter board 2 is less than the size of the mother board 1, the daughter board 2 is arranged close to the passive area B, and an orthographic projection of the daughter board 2 on the first substrate 11 does not exceed edges of the first substrate 11.

In some embodiments, as shown in FIGS. 2B and 2C, the mother board 1 has a shape of a rectangle. The active area A and the passive area B are arranged in sequence in a first direction (indicated by the arrow a in FIG. 2B or 2C), and the first direction is a direction represented by a long side or a short side of the rectangle. In a case where the first direction is the direction represented by the long side of the rectangle, as shown in FIGS. 2B and 2C, the at least one side wiring 4 is disposed on a side of the wiring board assembly 10 corresponding to the short side of the rectangle. In a case where the first direction is the direction represented by the short side of the rectangle, the at least one side wiring 4 is disposed on a side of the wiring board assembly 10 corresponding to the long side of the rectangle.

In these embodiments, as shown in FIGS. 2A and 2C, in an example where the daughter board 2 also has a shape of a rectangle, in a case where the active area A and the passive area B are arranged in sequence in the first direction, and the first direction is the direction represented by the long side of the rectangle, there is a first gap G1 between an orthographic projection of an edge of the daughter board 2 proximate to the passive area B on the first substrate 11 and an edge of the first substrate 11 corresponding to the short side of the rectangle and the edge of the daughter board 2; in a case where the active area A and the passive area B are arranged in sequence in the first direction, and the first direction is the direction represented by the short side of the rectangle, there is a second gap G2 between the orthographic projection of the edge of the daughter board 2 proximate to the passive area B on the first substrate 11 and an edge of the first substrate 11 corresponding to the long side of the rectangle and the edge of the daughter board 2. In these embodiments, as shown in FIG. 2C, the case that the first direction is the direction represented by the long side of the rectangle is shown. Those skilled in the art can understand that in the case where the first direction is direction represented by the short side of the rectangle, the first gap G1 shown in FIG. 2C may be replaced with the second gap G2.

In addition, in some embodiments, in the case where the first direction is the direction represented by the long side of the rectangle, the first gap G1 is less than or equal to 50 microns. In the case where the first direction is the direction represented by the short side of the rectangular shape, the second gap G2 is less than or equal to 50 microns.

An extending direction of the at least one fan-out wiring 222 is not specifically limited, as long as two ends of each fan-out wiring 222 are respectively electrically connected to a third connection pad 223 and a second connection pad 221.

In some embodiments, as shown in FIGS. 2B and 2C, the second connection pad(s) 221 are arranged close to the passive area B, and there are a plurality of first connection pads 122 and a plurality of second connection pads 221. The plurality of first connection pads 122 are arranged in sequence in a second direction (indicated by the arrow b in FIG. 2B or FIG. 2C), and the plurality of second connection pads 221 are arranged in sequence in the second direction. Moreover, each first connection pad 122 is in correspondence with a second connection pad 221 connected thereto in the thickness direction H of the second substrate 21. The second direction is perpendicular to the first direction.

In these embodiments, as shown in FIGS. 2A and 2C, the at least one fan-out wiring 222 may extend in the first direction. The second connection pad 221 is closer to the passive area B than the first connection pad 122. In addition, in a case where there are the plurality of first connection pads 122 and the plurality of second connection pads 221, the first connection pads 122 may be in one-to-one correspondence with the second connection pads 221 respectively connected to the first connection pads 122 in the thickness direction H of the second substrate 21, so that the at least one side wiring 4 may extend in the thickness direction H of the second substrate 21, thereby preventing the at least one side wiring 4 from being bent or broken.

In some embodiments, as shown in FIGS. 2A, 2B and 2C, the wiring board assembly 10 further includes a protective layer 6 disposed on the at least one side wiring 4, and an orthographic projection of edges of the protective layer 6 on the first substrate 11 exceeds an orthographic projection of edges of the at least one side wiring 4 on the first substrate 11.

In these embodiments, the protective layer 6 may be made of, for example, an insulating material, such as silicon nitride (SiN) or epoxy resin, and may protect the at least one side wiring 4.

In some embodiments, a distance g2 between an edge of the protective layer 6 and a corresponding edge of an entirety of the at least one side wiring 4 is greater than or equal to 20 microns.

In these embodiments, by controlling the distance g2 between the edge of the protective layer 6 and the corresponding edge of the entirety of the at least one side wiring 4 to be greater than or equal to 20 microns, the protective layer 6 may be ensured to completely covers the at least one side wiring 4 to avoid an electric leakage.

Figure 4:
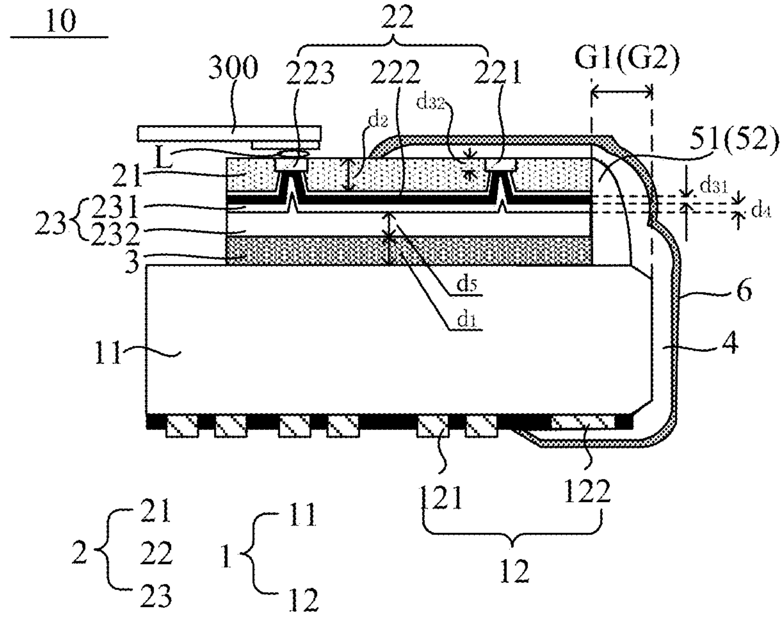
FIG. 4 is a sectional view of yet another wiring board assembly, in accordance with some embodiments.

In some embodiments, as shown in FIG. 4, in the case where the active area and the passive area are arranged in sequence in the first direction, and the first direction is the direction represented by the long side of the rectangle, the wiring board assembly further includes a first level difference filling layer 51. The first level difference filling layer 51 is disposed between the daughter board and the at least one side wiring 4, and is located in the first gap G1. In the case where the active area A and the passive area B are arranged in sequence in the first direction, and the first direction is the direction represented by the short side of the rectangle, the wiring board assembly 10 further includes a second level difference filling layer 52. The second level difference filling layer 52 is disposed between the daughter board 2 and the at least one side wiring 4, and is located in the second gap G2.

In these embodiments, by arranging the first level difference filling layer 51 in the first gap G1, the first gap G1 may be filled to reduce a level difference at the first gap G1, so as to avoid a problem that the manufacturing of the side wiring(s) is not facilitated due to an excessive level difference. For example, the excessive level difference is not conducive to forming the at least one side wiring by using exposure and development methods. Alternatively, by arranging the second level difference filling layer in the second gap G2, the second gap G2 may be filled to reduce a level difference at the second gap G2, so as to avoid a problem that the manufacturing of the side wiring(s) is not facilitated due to an excessive level difference. For example, the excessive level difference is not conducive to forming the at least one side wiring 4 by using exposure and development methods.

In some embodiments, the first level difference filling layer 51 may be made of an organic material for planarizing the first gap G1, or the second level difference filling layer 52 may be made of an organic material for planarizing the second gap G2.

In some embodiments, as shown in FIG. 4, in a case where the wiring board assembly 10 includes the first level difference filling layer 51, a surface of the first level difference filling layer 51 opposite to the side of the wiring board assembly 10 where the at least one side wiring 4 is located is an arc-shaped surface. In a case where the wiring board assembly 10 includes the second level difference filling layer 52, a surface of the second level difference filling layer 52 opposite to the side of the wiring board assembly 10 where the at least one side wiring 4 is located is an arc-shaped surface.

In these embodiments, a risk of wire breakage may be avoided by arranging the surface of the first level difference filling layer 51 opposite to the side of the wiring board assembly 10 where the at least one side wiring 4 is located to be the arc-shaped surface, or by arranging the surface of the second level difference filling layer 52 opposite to the side of the wiring board assembly 10 where the at least one side wiring 4 is located to be the arc-shaped surface.

Of course, in some embodiments, in order to reduce the level difference, thicknesses of the bonding layer 3 and the second substrate 21 may be thinned.

For example, in some embodiments, as shown in FIG. 4, the thickness $d_1$ of the bonding layer 3 is in a range of 8 microns to 15 microns, inclusive, and the thickness d2 of the second substrate 21 is in a range of 5 microns to 20 microns, inclusive.

In some embodiments, in the case where the second wiring layer 22 is disposed on the side of the second substrate 21 proximate to the mother board 1, or in the case where the second wiring layer 22 is disposed on the side of the second substrate 21 away from the mother board 1, a thickness of the second wiring layer 22 is in a range of 0.6 microns to 2 microns, inclusive.

In these embodiments, in the case where the second wiring layer 22 is disposed on the side of the second substrate 21 proximate to the mother board 1, or in the case where the second wiring layer 22 is disposed on the side of the second substrate 21 away from the mother board 1, the level difference may be further reduced by limiting the thickness of the second wiring layer 22 to the range of 0.6 microns to 2 microns.

In some other embodiments, as shown in FIG. 4, in the case where the second wiring layer 22 includes the first sub-layer **22*a* and the second sub-layer 22*b*, the thickness d31 of the first sub-layer 22*a* and the thickness d32 of the second sub-layer 22*b*** are each in a range of 0.6 microns to 2 microns.

In these embodiments, by limiting the thickness d31 of the first sub-layer **22*a* and the thickness d32 of the second sub-layer 22*b*** to the above range, the level difference may also be further reduced.

In some embodiments, as shown in FIG. 4, in a case where the daughter board 2 further includes the insulating layer 23, and the insulating layer 23 includes the inorganic insulating layer 231 and the organic insulating layer 232, a thickness d4 of the inorganic insulating layer 231 may be in a range of 0.3 microns to 0.6 microns, inclusive, and a thickness d5 of the organic insulating layer 232 may be in a range of 2 microns to 4 microns, inclusive, which may also reduce the level difference.

In some embodiments, as shown in FIG. 4, a side surface of the first substrate 11 on which the at least one side wiring 4 is disposed is connected to a surface of the first substrate 11 on which the electronic element(s) are disposed through an arc-shaped surface or an inclined surface. The side surface of the first substrate 11 on which the at least one side wiring 4 is disposed is connected to a surface of the first substrate 11 that is opposite to the surface of the first substrate 11 on which the electronic element(s) are disposed through an arc-shaped surface or an inclined surface.

In these embodiments, the risk of wire breakage may be avoided by arranging chamfer structure(s) or rounded corner structure(s) at a position of the first substrate 11 corresponding to the side of the wiring board assembly 10 where the at least one side wiring 4 is located.

The specific structure of the wiring board assembly 10 is described above.

Hereinafter, a connection method of the wiring board assembly 10 and the electronic element(s) 20, a structure of the first wiring layer 12, and a specific drive method of the functional backplane will be introduced.

Figure 5:
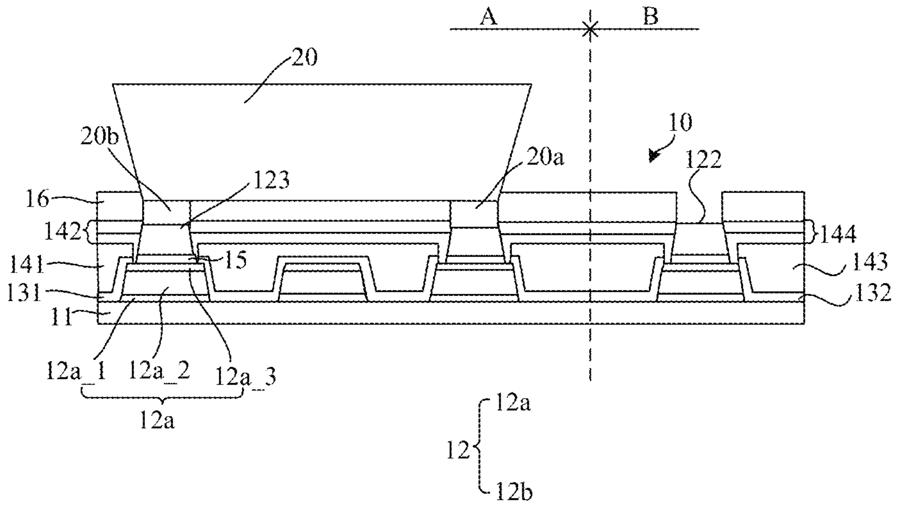
FIG. 5 is a sectional view of a mother board and an electronic element, in accordance with some embodiments.

In some embodiments, as shown in FIG. 5, in an example where each electronic element 20 is a micro light-emitting diode, the electronic element 20 has two pins, i.e., a cathode pin **20*a* and an anode pin 20*b*, respectively. The first wiring layer 12 further includes a plurality of fourth connection pads 123, and the electronic element 20 is electrically connected to fourth connection pads 123 through respective pins, so that the electronic element 20 is electrically connected to the wiring board assembly 10. In some embodiments, as shown in FIG. 5, the first wiring layer 12 may include a first routing layers 12*a* located between the fourth connection pads 123 and the first substrate 11. The first routing layer 12*a* includes first sub-metal layers 12*a*_1, first sub-routing layers 12*a*_2 and second sub-metal layers 12*a*_3, and a first sub-metal layer 12*a*_1, a first sub-routing layer 12*a*_2 and a second sub-metal layer 12*a*_3 are stacked. The fourth connection pad 123 and the first connection pad 122 are respectively electrically connected to different conductive patterns/conductive wirings in the second sub-metal layers 12*a*_3**.

In some embodiments, the plurality of fourth connection pads 123 may be divided into a plurality of fourth connection pad groups. Each fourth connection pad group is used to be connected to an electronic element 20, and includes a cathode bonding pad and an anode bonding pad arranged in pair. A fourth connection pad 123 soldered to the cathode pin of the electronic element 20 is referred to as a cathode bonding pad, and a fourth connection pad 123 soldered to the anode pin of the electronic element is referred to as an anode bonding pad.

A material of the first sub-metal layer **12*a*_1 and a material of the second sub-metal layer 12*a*_3 each include a molybdenum niobium alloy that has adhesion to enhance an adhesion force between the first routing layer 12*a* and the first substrate 11. In some cases, in order to prevent the first substrate 11 from being damaged due to an excessive stress caused by an excessive overall area of an orthographic projection of the first routing layer 12*a* on the first substrate 11, a buffer layer may be provided between the first substrate 11 and the first routing layer 12*a* to relieve the stress. In addition, the first sub-metal layer 12*a*_1 including the molybdenum niobium alloy may further enhance an adhesion force between the first routing layer 12*a* and the buffer layer. A material of the buffer layer may be, for example, silicon nitride. Moreover, the second sub-metal layer 12*a*_3 including the molybdenum niobium alloy is connected to the fourth connection pads 123, and since the molybdenum niobium alloy has adhesion, connection stability between the first routing layer 12*a* and the fourth connection pad 123 may be ensured; and since the molybdenum niobium alloy has conductivity, conductivity between the fourth connection pad 123 and the first routing layer 12*a* may be ensured. A material of the first sub-routing layer 12*a*_2 may include copper that has good conductivity, which may ensure electrical connections between film layers. Copper has a small resistance, which may reduce a current loss during operation, and copper has a low price, which may reduce the manufacturing cost of the functional backplane. In addition, the second sub-metal layer 12*a*_3 including the molybdenum niobium alloy may protect copper in the first sub-routing layer 12*a*_2** from being oxidized.

In some embodiments, as shown in FIG. 5, a thickness of the first sub-routing layer **12*a*_2** may be in a range of 1 micron to 3 microns, inclusive.

In some embodiments, as shown in FIG. 5, as an example, a film layer of the first connection pad(s) 122 is arranged in a same layer as the fourth connection pads 123. Of course, the film layer of the first connection pad(s) 122 may be arranged in a same layer as the first routing layer **12*a*, or the film layer of the first connection pad(s) 122 is arranged in a same layer as an entirety of the first routing layer 12*a* and the fourth connection pads 123**.

In some embodiments, as shown in FIG. 5, the active area A further includes a first passivation layer 131 located between the first routing layer **12*a* and the fourth connection pads 123, a first planarization layer 141 located between the first passivation layer 131 and the fourth connection pads 123, and a second planarization layer 142 located on a side of the fourth connection pads 123 away from the first substrate 11 and covering area(s) between the plurality of fourth connection pads 123**.

Figure 6:
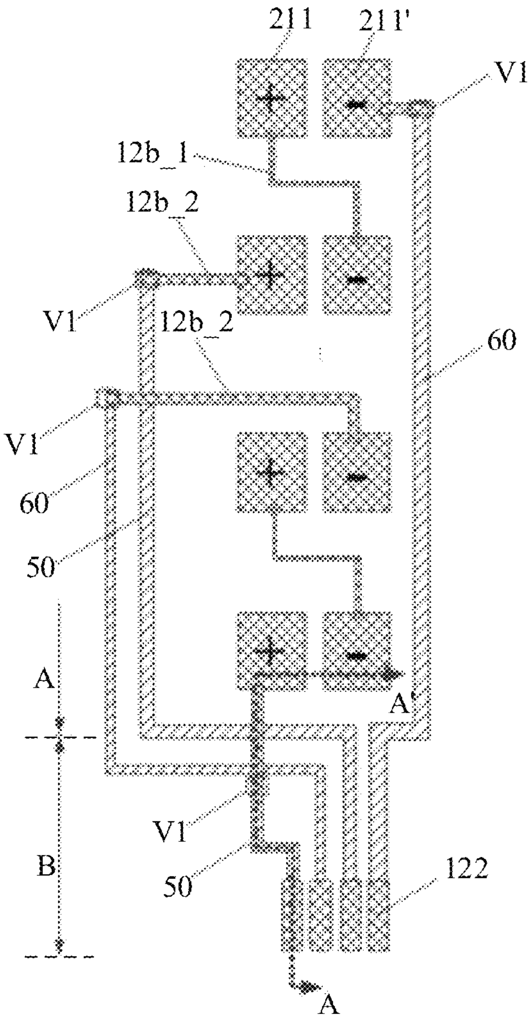
FIG. 6 is a top view of a first wiring layer and first connection pad(s), in accordance with some embodiments.
Figure 7:
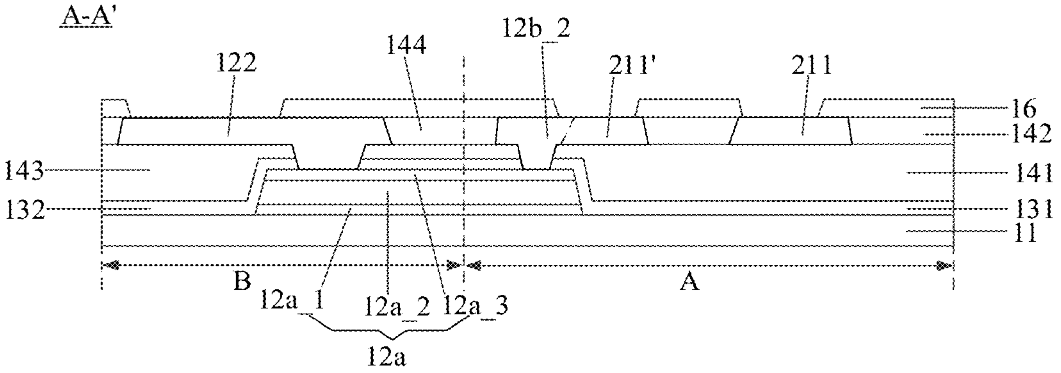
FIG. 7 is a sectional view taken along the AA' direction in FIG. 6, in accordance with some embodiments.

As shown in FIGS. 6 and 7, FIG. 7 is a sectional view taken along the AA' direction in FIG. 6. The first routing layer **12*a* may include anode wirings 50 and cathode wirings 60. That is, the anode wiring 50 and the cathode wiring 60 are each made of the first sub-metal layer 12*a*_1, the first sub-routing layer 12*a*_2 and the second sub-metal layer 12*a*_3 that are stacked. In order to reduce a voltage drop (i.e., IR drop), the thickness of the first sub-routing layer 12*a*_2 is positively correlated with the size of the mother board. The first sub-metal layer 12*a*_1, the first sub-routing layer 12*a*_2, and the second sub-metal layer 12*a*_3 may be sequentially manufactured by using a sputtering process, and the second sub-metal layer 12*a*_3 may protect the first sub-routing layer 12*a*_2, so as to prevent a surface of the first sub-routing layer 12*a*_2** from being oxidized.

In some embodiments, as shown in FIG. 7, the first passivation layer 131 includes portions each located between the anode wiring 50 and the cathode wiring 60 and portions each separating adjacent wirings, so as to prevent adjacent wirings from being erroneously electrical connected. The first passivation layer 131 may be made of silicon nitride, silicon oxide, or silicon oxynitride. The first planarization layer 141 covers areas between the anode wirings 50 and the cathode wirings 60. The first planarization layer 141 may be an organic film for filling gap areas between the wirings, so as to avoid a large level difference in a subsequent process, which ensures that the electronic element is not shifted when this electronic element is connected to the wiring board assembly, thereby improving a flatness of the functional backplane. Moreover, the first planarization layer 141 may function as an insulator.

In some embodiments, as shown in FIG. 7, a thickness of the first passivation layer 131 may be in a range of 1000 angstroms to 4000 angstroms, inclusive.

In some embodiments, as shown in FIG. 5, the wiring board assembly 10 may further include adhesion layers 15 each disposed between the fourth connection pad 123 and the first planarization layer 141. A material of the adhesion layer 15 may include a molybdenum niobium alloy, and the molybdenum niobium alloy has adhesion, and may enhance an adhesion force between the fourth connection pad 123 and the first planarization layer 141.

In some embodiments, as shown in FIGS. 5 and 7, the passive area B further includes a second passivation layer 132 located between the first routing layer **12*a* and the first connection pad(s) 122, a third planarization layer 143 located between the second passivation layer 132 and the first connection pad(s) 122, a fourth planarization layer 144 located on the side of the fourth connection pads 123 away from the first substrate 11 and covering area(s) between the at least one first connection pad 122**.

The third planarization layer 143 and the first planarization layer 141 are arranged in the same layer, and may be of an integral structure. The third planarization layer 143 and the first planarization layer 141 may be made of an organic material (e.g., resin) for planarization, so as to facilitate manufacturing in a subsequent process (e.g., manufacturing of the fourth connection pads 123 and the first connection pad(s) 122). The fourth planarization layer 144 and the second planarization layer 142 are arranged in the same layer, and may be of an integral structure. The fourth planarization layer 144 and the second planarization layer 142 may be made of an organic material (e.g., resin) for planarization, so as to facilitate manufacturing in a subsequent process (e.g., manufacturing of the protective layer 16). The second passivation layer 132 and the first passivation layer 131 are arranged in the same layer, and may be of an integral structure.

The second passivation layer 132 and the first passivation layer 131 may be made of silicon oxynitride, silicon nitride, or silicon oxide.

As shown in FIG. 5, a thickness of the second passivation layer 132 may be in a range of 1000 angstroms to 9000 angstroms, inclusive.

In some embodiments, the plurality of fourth connection pads may be divided into a plurality of fourth connection pad groups. Each fourth connection pad group is used to be connected an electronic element, and includes a cathode bonding pad and an anode bonding pad arranged in pair. A body material layer included in a fourth connection pad soldered to the cathode pin of the electronic element is referred to as a cathode bonding pad, and a body material layer included in a fourth connection pad soldered to the anode pin of the electronic element is referred to as an anode bonding pad. As shown in FIG. 6, each fourth connection pad group includes the cathode bonding pad 211' and the anode bonding pad 211 arranged in pair, and the cathode bonding pad 211' and the anode bonding pad 211 include the same film layer structure.

In a specific implementation, in the functional backplane provided in the embodiments of the present disclosure, as shown in FIGS. 6 and 7, the plurality of fourth connection pads are divided into the plurality of fourth connection pad groups, and each fourth connection pad group includes the cathode bonding pad 211' and the anode bonding pad 211.

In some embodiments, as shown in FIGS. 5, 6 and 7, the first wiring layer 12 further includes a second routing layer 12*b* arranged in the same layer as the plurality of fourth connection pads 123. The second routing layer 12*b* is used to realize series connection(s) or parallel connection(s) between the plurality of fourth connection pad groups, and the second routing layer is electrically connected to the first routing layer 12*a* through a via penetrating the first planarization layer 141 and the first passivation layer 131.

As shown in FIGS. 6 and 7, the second routing layer includes wirings 12*b*_1 and wirings 12*b*_2. As shown in FIG. 7, the wiring 12*b*_2 and the fourth connection pad 123 are of an integral structure. The wiring 12*b*_2 and the fourth connection pad 123 are separated by the dashed line in FIG. 7.

Specific connections between the plurality of fourth connection pad groups are not limited. FIG. 6 exemplarily illustrates that two adjacent fourth connection pad groups are connected in series. As shown in FIGS. 6 and 7, the plurality of fourth connection pads 123 may be divided into the plurality of fourth connection pad groups. Each fourth connection pad group is used to be bonded to a micro light-emitting diode, and includes the cathode bonding pad and the anode bonding pad arranged in pair. The first routing layer 12*a* may include the anode wirings 50 and the cathode wirings 60. Two adjacent fourth connection pad groups are connected in series by a wiring 12*b*_1. As shown in FIGS. 6 and 7, in two fourth connection pad groups connected in series, an anode bonding pad in a fourth connection pad group is connected to a wiring 12*b*_2, the wiring 12*b*_2 is electrically connected to an anode wiring 50 through a via V1 penetrating the first passivation layer 131 and the first planarization layer 141, and the anode wiring 50 is electrically connected to a first connection pad 122 through a via penetrating the second passivation layer 132 and the third planarization layer 143; a cathode bonding pad in another fourth connection pad group is connected to another wiring 12*b*_2, the another wiring 12*b*_2 is electrically connected to a cathode wiring 60 through another via V1 penetrating the first passivation layer 131 and the first planarization layer 141, and the cathode wiring 60 is electrically connected to another first connection pad 122 through a via penetrating the second passivation layer 132 and the third planarization layer 143. In FIG. 6, the cathode bonding pads, the anode bonding pads, the first connection pads 122, the wirings 12*b*_1 and the wirings 12*b*_2 are arranged in the same layer, and are represented by the same filling pattern. The anode wirings 50 and the cathode wirings 60 are arranged in the same layer, and are represented by the same filling pattern.

It can be understood that the drive method of the functional backplane is not limited. As shown in FIG. 6, in the functional backplane, light-emitting units may be driven in a passive method, or a driving circuit including thin film transistors may provide a signal to a light-emitting unit, or a micro integrated circuit chip may provide a signal to a light-emitting unit.

When the micro integrated circuit chip provides the signal to the light-emitting unit, each micro integrated circuit chip includes a plurality of pins, and the wiring board assembly further includes fifth connection pads located in the active area and bonded to pins of the micro integrated circuit chips. The fifth connection pad has a similar structure as the fourth connection pad, and may be manufactured by using the same film layer structure as the fourth connection pad. A plurality of electronic elements may be divided into a plurality of lamp areas, and each lamp area includes at least one electronic element.

Each micro integrated circuit chip is used for driving electronic elements in at least one lamp area to emit light.

Some embodiments of the present disclosure provide a manufacturing method of a wiring board assembly. The manufacturing method includes following steps. A mother board 1 and a daughter board 2 are manufactured separately. The mother board 1 includes a first substrate 11 and a first wiring layer 12 formed on the first substrate 11. The first wiring layer 12 includes at least one first connection pad 122. The daughter board 2 includes a second substrate 21 and a second wiring layer 22 formed on the second substrate 21. The second wiring layer 22 includes at least one second connection pad 221.

The first wiring layer 12 may further include driving element(s) 121 in addition to the at least one first connection pad 122. For example, in an example where the mother board 1 has an active area A and a passive area B located on a side of the active area A, the driving element(s) 121 may be located in the active area A, the at least one first connection pad 122 may be located in the passive area B, and the at least one first connection pad 122 is electrically connected to the driving element(s) 121. During manufacturing, the driving element(s) 121 and the at least one first connection pad 122 may be formed by one patterning process.

For example, in some embodiments, manufacturing the mother board 1, includes following steps.

The first wiring layer 12 is formed on the first substrate 11.

The first substrate 11 may be a rigid substrate or a flexible substrate. For example, in a case where the first substrate 11 is the rigid substrate, the first substrate 11 may be a glass substrate or a ceramic substrate, and in this case, the first wiring layer 12 may be directly formed on the first substrate 11. In a case where the first substrate 11 is the flexible substrate, the first substrate 11 may be supported by a rigid substrate to form the first wiring layer 12 on the first substrate 11, and the first substrate 11 on which the first wiring layer 12 is formed is peeled from the rigid substrate finally.

In some examples, manufacturing the mother board, specifically includes following steps.

In Step 1), a first sub-metal layer **12*a*_1, a first sub-routing layer 12*a*_2, and a second sub-metal layer 12*a*_3 are formed on a base substrate 1. A material of the first sub-metal layer 12*a*_1 and a material of the second sub-metal layer 12*a*_3 each may be a molybdenum-containing alloy. The molybdenum-containing alloy has adhesion and oxidation resistance, may be manufactured by a sputtering process, and has a thickness in a range of hundreds to thousands of angstroms (Å). A material of the first sub-routing layer 12*a*_2 may be copper. The first sub-routing layer 12*a*_2** may have a thickness in a range of 1 μm to 5 μm, inclusive, and may be formed by a sputtering process or an electroplating process.

Of course, the first sub-metal layer **12*a*_1, the first sub-routing layer 12*a*_2 and the second sub-metal layer 12*a*_3** each may be formed by continuous deposition and patterning processes.

In Step 2), a first passivation layer (made of SiN) 131 is deposited, and is patterned to form vias. The first passivation layer 131 has a thickness in a range of 1000 Å to 4000 Å, inclusive.

In Step 3), a first planarization layer 141 is formed on the first substrate 11 on which the first passivation layer 131 is formed, and is patterned to form vias.

In Step 4), an adhesion layer 15 and a second routing layer are formed. The second routing layer **12*b* includes first connection pad(s) 122 and fourth connection pads 123. The adhesion layer 15 is electrically connected to the second sub-metal layer 12*a*_3 through the vias in the first passivation layer 131 and the vias in the first planarization layer 141**.

In Step 5), a second passivation layer 132, a second planarization layer 142 and a protective layer 16 are deposited, and are patterned to expose the first connection pad(s) 122.

An orthographic projection of the first connection pad 122 on the first substrate 11 may have a rectangular shape. As shown in FIG. 5, the orthographic projection of the first connection pad on the first substrate 11 has a length in a range of about 0.08 mm to 0.2 mm, and has a width of greater than 0.06 mm, such as 0.07 mm.

In some embodiments, similar to the first substrate 11, the second substrate 21 may also be a rigid substrate or a flexible substrate, which is not specifically limited here.

In some embodiments, in a case where the second substrate 21 is the rigid substrate, manufacturing the daughter board 2, includes a following step.

The second wiring layer 22 is directly formed on the second substrate 21 to obtain the daughter board 2.

The second substrate 21 may be, for example, a glass substrate, and in this case, the second wiring layer 22 may be formed on the second substrate 21 by film formation, exposure and development processes.

Figure 8A:
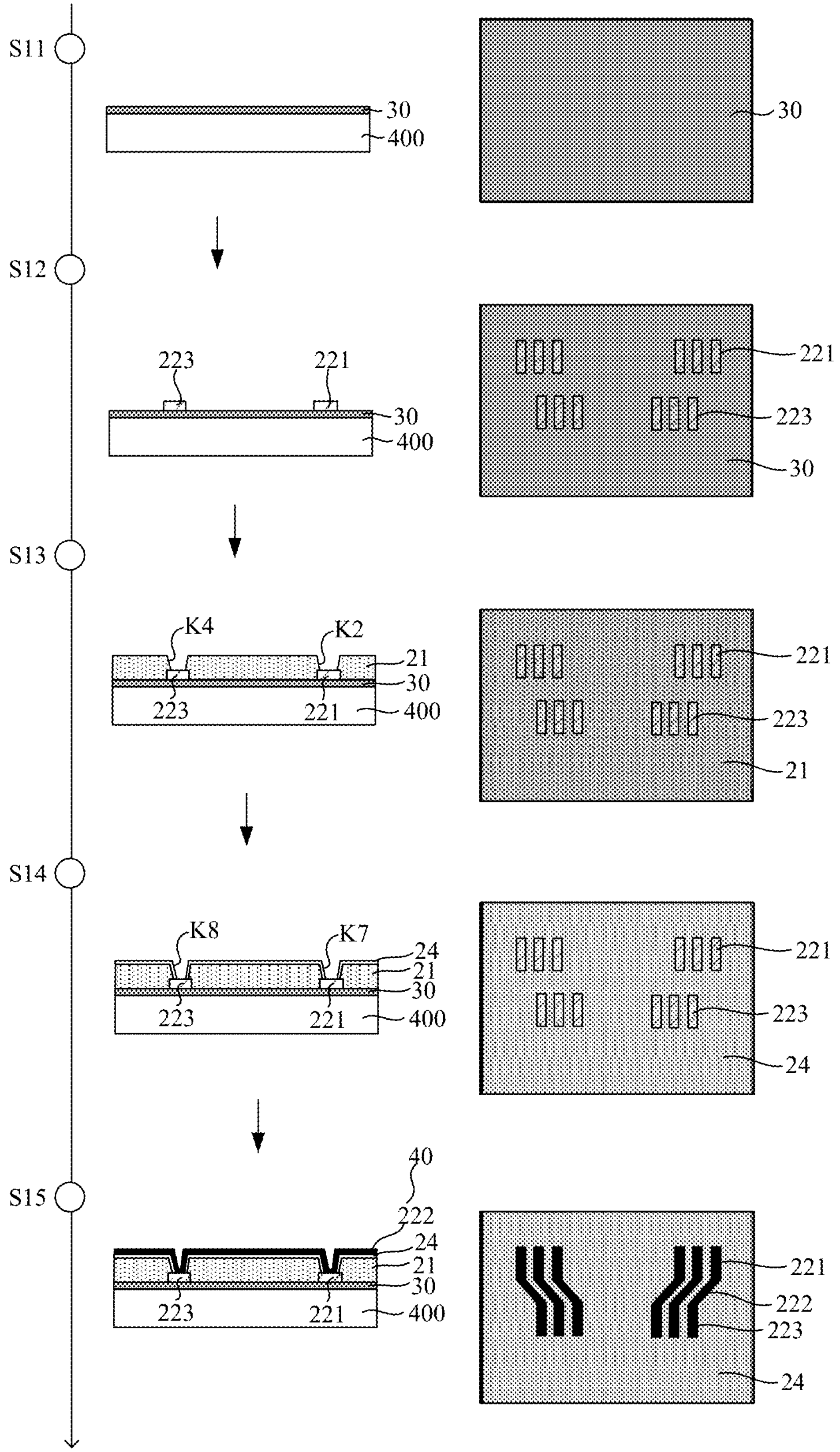
FIG. 8A is a flow diagram of forming a second wiring layer on a third substrate, in accordance with some embodiments.
Figure 8B:
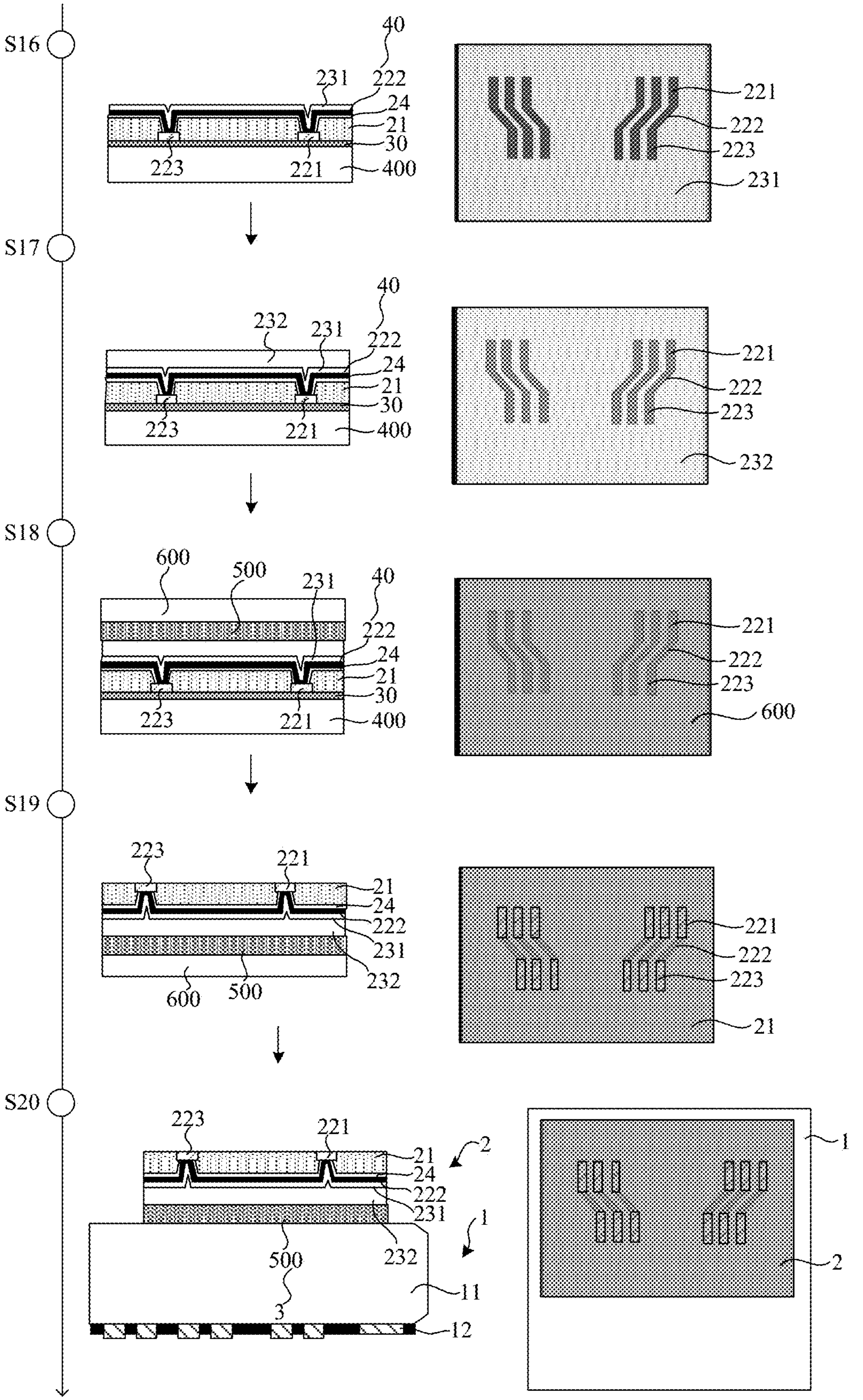
FIG. 8B is a flow diagram of forming a glue layer and a release layer on a third substrate and bonding a daughter board to a mother board, in accordance with some embodiments.

In some other embodiments, in a case where the second substrate 21 is the flexible substrate, manufacturing the daughter board 2, as shown in FIGS. 8A and 8B, includes S11 to S19.

In S11, a sacrificial layer 30 is formed on a third substrate 400.

For example, the sacrificial layer 30 may be modified, for example, decomposed or gasified, after being heated or irradiated with light, and may have a thickness in a range of 3 nm to 30 nm, inclusive.

The third substrate 400 may be used as a support layer. For example, a material of the third substrate 400 may be selected from rigid materials such as glass, quartz and plastic.

In S12, the at least one second connection pad 221 is formed on the third substrate 400 on which the sacrificial layer 30 is formed.

Of course, in a case where the daughter board further includes at least one fan-out wiring 222 and at least one third connection pad 223, the at least one third connection pad 223 and the at least one second connection pad 221 may be formed by one patterning process.

The second connection pad 221 may have a stacked structure of Ti/Al/Ti,

Mo/Cu/Mo or Ti/Cu/Ti, and may be formed by film formation, exposure, development and etching processes.

In S13, a flexible film is formed on the third substrate 400 on which the at least one second connection pad 221 is formed, and at least one second via K2 is formed in the flexible film. Each second via K2 corresponds to a second connection pad 221.

The flexible film may be formed on the third substrate 400 by a coating process, and the at least one second via K2 may be formed in the flexible film by exposure, development and etching processes, so as to obtain the second substrate 21.

In order to facilitate peeling the second substrate 21 and the at least one second connection pad 221 from the third substrate 400 in a subsequent process, an edge of each second via K2 proximate to a corresponding second connection pad 221 is located within an orthographic projection of the second connection pad 221 on the second substrate 21, and a distance between an orthographic projection of the edge of each second via K2 on the second substrate 21 and an orthographic projection, on the second substrate 21, of edges of the second connection pad 221 corresponding to this second via K2 is in a range of 10 microns and 30 microns, inclusive, so that a contact area of the at least one second connection pad 221 and the second substrate 21 may be increased, thereby improving the peeling efficiency and preventing the at least one second connection pad 221 from falling off.

In the case where the daughter board further includes the at least one fan-out wiring 222 and the at least one third connection pad 223, manufacturing the daughter board 2, further includes: forming at least one fourth via K4 in the flexible film. Each fourth via K4 corresponds to a third connection pad 223.

In S14, a buffer layer 24 is formed on the third substrate 400 on which the at least one second via K2 is formed. The buffer layer 24 is provided with seventh via(s) K7 each corresponding to a second via K2, and eighth via(s) K8 each corresponding to a fourth via K4. The buffer layer 24 may function to isolate water and oxygen. The buffer layer 24 may be made of SiO, SiN or SiON, and may be formed by using film formation, exposure, development and etching processes.

In S15, a third wiring layer 40 is formed on the third substrate 400 on which the buffer layer 24 is formed. Each second connection pad 221 is electrically connected to the third wiring layer 40 through a second via K2.

In the case where the daughter board further includes the at least one fan-out wiring 222 and the at least one third connection pad 223, the third wiring layer 40 may include the at least one fan-out wiring 222. An end of a fan-out wiring 222 is electrically connected to the second connection pad 221 through a second via K2 and a seventh via, and another end of the fan-out wiring 222 is electrically connected to a third connection pad 223 through a fourth via K4 and an eighth via.

The third wiring layer 40 may have a stacked structure of Ti/Al/Ti, Mo/Cu/Mo or Ti/Cu/Ti, and may be formed by film formation, exposure, development and etching processes.

In S16, as shown in FIG. 8B, an inorganic insulating layer 231 is formed on the third substrate 400 on which the third wiring layer 40 is formed. The inorganic insulating layer 231 may be made of SiO, SiN or SiON, and may be formed by deposition. The inorganic insulating layer 231 may function to isolate water and oxygen.

In S17, an organic insulating layer 232 is formed on the third substrate 400 on which the inorganic insulating layer 231 is formed. The organic insulating layer 232 may be made of a resin material (e.g., an epoxy resin material), and may be formed by a coating process to have a planarization function.

In S19, the sacrificial layer 30 is heated, or is irradiated with light to separate the second substrate 21 and the at least one second connection pad 221 from the third substrate 400, so as to obtain the daughter board 2.

The second substrate 21 and the at least one second connection pad 221 may be peeled from the third substrate 400 by laser peeling. After the peeling, the at least one second connection pad 221 is exposed.

The manufacturing method of the wiring board assembly 10 further includes S20 to S22. In S20, a bonding layer 3 is formed between the mother board 1 and the daughter board 2 to connect the mother board 1 and the daughter board 2. The daughter board 2 is formed on a side of the first substrate 11 away from the first wiring layer 12.

The bonding layer 3 may be, for example, an adhesive layer, and a material of the bonding layer 3 includes an adhesive. Before the sacrificial layer 30 is heated or irradiated with light to separate the second substrate 21 and the at least one second connection pad 221 from the third substrate 400, manufacturing the daughter board 2 further includes: sequentially forming a glue layer 500 and a release layer 600 on the third substrate 400 on which the third wiring layer 40 is formed in S18. After the sacrificial layer 30 is heated or irradiated with light to separate the second substrate 21 and the at least one second connection pad 221 from the third substrate 400, the manufacturing method of the wiring board assembly 10 further includes: removing the release layer 600 to expose the glue layer 500, so as to adhere the mother board 1 to the daughter board 2 by using the glue layer in S20.

Figure 8C:
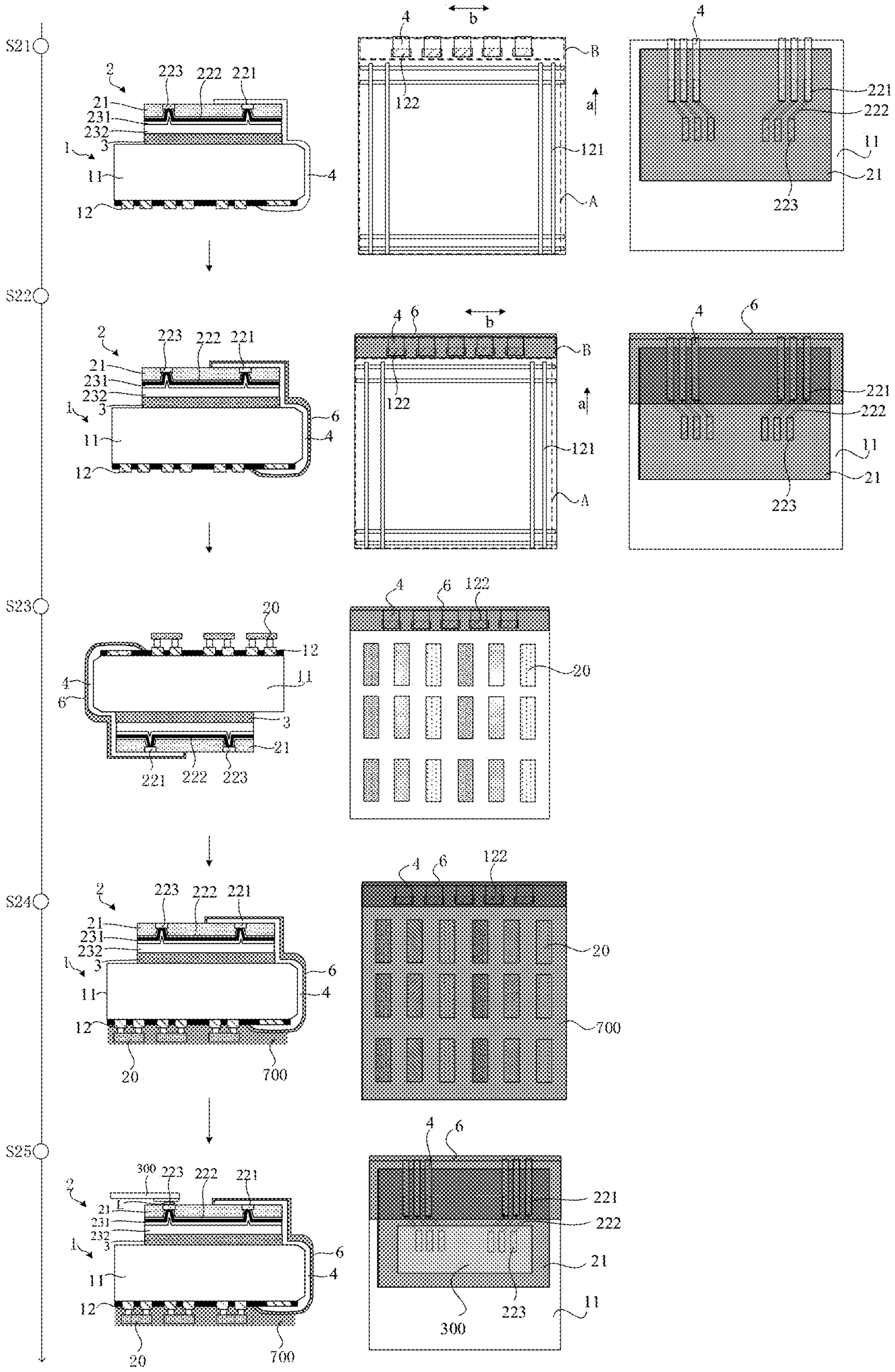
FIG. 8C is a flow diagram of forming at least one side wiring, electronic element(s) and a circuit board on a mother board and a daughter board, in accordance with some embodiments.

In S21, as shown in FIG. 8C, at least one side wiring 4 is formed on the mother board 1 and the daughter board 2. The at least one side wiring 4 is connected, via its respective end, to the at least one first connection pad 122 in one-to-one correspondence, and the at least one side wiring 4 is connected, via its respective another end, to the at least one second connection pad 221 in one-to-one correspondence.

For example, the at least one side wiring 4 may be formed by using film formation, exposure, development and etching processes, or the at least one side wiring 4 may be formed by using an inkjet printing process, which is not specifically limited here.

In some embodiments, in a case where the active area A and the passive area B are arranged in sequence in a first direction (indicated by the arrow a in FIG. 8C), the at least one second connection pad 221 is arranged close to the passive area B, there are a plurality of first connection pads 122 and a plurality of second connection pads 221, the plurality of first connection pads 122 are arranged in sequence in a second direction (indicated by the arrow b in FIG. 8C), and the plurality of second connection pads 221 are arranged in sequence in the second direction, before the at least one side wiring 4 is formed on the mother board 1 and the daughter board 2, the manufacturing method of the wiring board assembly 10 further includes: aligning orthographic projection(s) of the at least one second connection pad 221 on the first substrate 11 and orthographic projection(s) of the at least one first connection pad 122 on the first substrate 11 in one-to-one correspondence in the first direction.

In this case, the orthographic projection(s) of the at least one second connection pad 221 and the orthographic projection(s) of the at least one first connection pad 122 may be aligned in one-to-one correspondence in the first direction by providing alignment marks on the second substrate 21 and the first substrate 11.

In some embodiments, an alignment accuracy of the orthographic projection(s) of the at least one second connection pad 221 and the orthographic projection(s) of the at least one first connection pad 122 in the first direction is controlled in a range of +15 microns.

In theory, when a center of the orthographic projection of the first connection pad 122 in the second direction and a center of the orthographic projection of the second connection pad 221 in the second direction are located on a same straight line extending along the first direction, the orthographic projection of the first connection pad 122 and the orthographic projection of the second connection pad 221 are considered to be completely aligned. However, if the center of the orthographic projection of the second connection pad 221 in the second direction is shifted to the left or the right in the second direction with respect to the center of the orthographic projection of the first connection pad 122 in the second direction, the alignment accuracy may be represented by a range consisting of a negative shift amount of the left shift and a positive shift amount of the right shift. That is, when the center of the orthographic projection of the second connection pad 221 in the second direction is shifted by 15 microns to the left with respect to the center of the orthographic projection of the first connection pad 122 in the second direction, the alignment accuracy is-15 microns, and when the center of the orthographic projection of the second connection pad 221 in the second direction is shifted by 15 microns to the right with respect to the center of the orthographic projection of the first connection pad 122 in the second direction, the alignment accuracy is +15 microns.

In S22, a protective layer 6 is formed on the mother board 1 and the daughter board 2 on which the at least one side wiring 4 is formed. The protective layer 6 is formed on the at least one side wiring 4, and an orthographic projection of edges of the protective layer 6 on the first substrate 11 exceeds an orthographic projection of edges of the at least one side wiring 4 on the first substrate 11.

The protective layer 6 may be made of an inorganic insulating material (e.g., SiN) or an organic material (e.g., an epoxy resin material), and may be formed by a deposition process or a printing process.

In some embodiments, as shown in FIG. 8C, after the wiring board assembly 10 is formed, S23 to S25 may be further included.

In S23, electronic elements 20 (e.g., light-emitting diode(s), LED) are soldered to the mother board 1, and each electronic element 20 is electrically connected to a portion (e.g., a driving element) of the first wiring layer 12 on the mother board 1 located in the active area A.

In S24, an encapsulation layer 700 is formed on the mother board 1 on which the electronic elements 20 are formed. In a case where the electronic element 20 is a micro inorganic light-emitting diode, the encapsulation layer 700 includes a portion covering the electronic elements 20 and a portion filling gap regions between the electronic elements 20. The encapsulation layer 700 may be an organic resin or a silica gel material in black, dark green, or dark gray. Since the inorganic light-emitting diode has a large light-emitting brightness, and the portion of the encapsulation layer 700 covering surfaces of the electronic elements 20 has a thickness of less than that of the portion of the encapsulation layer 700 filling the gap regions between the electronic elements 20, the light-emitting effect of the micro inorganic light-emitting diode may not be affected, and a high contrast may be achieved. For example, the encapsulation layer 700 may be manufactured by a coating process, a printing process, a filming-sticking process, a semiconductor film formation process, or a patterning process.

In S25, the circuit board 300 is bonded to the daughter board 2.

The sequence of S23, S24 and S25 may be adjusted according to actual needs. For example, the circuit board 300 may be bonded to the daughter board 2 firstly, and then, the encapsulation layer 700 is formed on the mother board 1 on which the electronic elements 20 are formed.

The foregoing descriptions are merely specific implementations of the present disclosure. However, the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A wiring board assembly, comprising:

a mother board and a daughter board that are stacked, and a bonding layer disposed between the mother board and the daughter board; and at least one side wiring;

wherein the mother board includes a first substrate and a first wiring layer disposed on the first substrate, and the first wiring layer includes at least one first connection pad; the daughter board is disposed on a side of the first substrate away from the first wiring layer; the daughter board includes a second substrate and a second wiring layer disposed on the second substrate, and the second wiring layer includes at least one second connection pad;

wherein the at least one side wiring is connected, via a respective end thereof, to the at least one first connection pad in one-to-one correspondence, and the at least one side wiring is connected, via respective another end thereof, to the at least one second connection pad in one-to-one correspondence; and the mother board has an active area and a passive area located on a side of the active area; and there is a gap between an orthographic projection, on the first substrate, of an edge of the daughter board proximate to the passive area and an edge of the first substrate proximate to the passive area.

2. The wiring board assembly according to claim 1, wherein the second wiring layer is disposed on a side of the second substrate proximate to the mother board; at least one first via is disposed in the second substrate, and each first via exposes a portion of the second wiring layer that constitutes a second connection pad in the at least one second connection pad;

or the second wiring layer includes a first sub-layer and a second sub-layer that are respectively disposed on two opposite sides of the second substrate in a thickness direction of the second substrate, and the first sub-layer is closer to the mother board than the second sub-layer; the second sub-layer includes the at least one second connection pad; at least one second via is disposed in the second substrate, and a second connection pad in the at least one second connection pad is electrically connected to the first sub-layer through a second via in the at least one second via;

or the second wiring layer is disposed on a side of the second substrate away from the mother board; the daughter board further includes an insulating layer disposed on a side of the second wiring layer away from the second substrate; at least one sixth via is disposed in the insulating layer, and each sixth via exposes a portion of the second wiring layer that constitutes a second connection pad in the at least one second connection pad.

3. The wiring board assembly according to claim 2, wherein in a case where the second wiring layer includes the first sub-layer and the second sub-layer, an orthographic projection of edges of each second connection pad on the second substrate exceeds an orthographic projection, on the second substrate, of an edge of a corresponding second via proximate to this second connection pad.

4. The wiring board assembly according to claim 3, wherein a distance between the orthographic projection of the edges of each second connection pad on the second substrate and the orthographic projection of the edge of the corresponding second via on the second substrate is in a range of 10 microns to 30 microns, inclusive.

5. The wiring board assembly according to claim 1, wherein the second wiring layer further includes at least one fan-out wiring and at least one third connection pad; wherein the at least one fan-out wiring is connected, via a respective end thereof, to the at least one third connection pad in one-to-one correspondence, and the at least one fan-out wiring is connected, via respective another end thereof, to the at least one second connection pad in one-to-one correspondence.

6. The wiring board assembly according to claim 5, wherein in a case where the second wiring layer is disposed on a side of the second substrate proximate to the mother board, at least one first via is disposed in the second substrate, and each first via exposes a portion of the second wiring layer that constitutes a second connection pad in the at least one second connection pad, the second wiring layer includes the at least one fan-out wiring; at least one third via is further disposed in the second substrate, and each third via exposes a portion of the second wiring layer that constitutes a third connection pad in the at least one third connection pad; the at least one first via is in one-to-one correspondence with the at least one third via, and a first via in the at least one first via and a corresponding third via in the at least one third via are located on a same fan-out wiring;

in a case where the second wiring layer includes a first sub-layer and a second sub-layer that are respectively disposed on two opposite sides of the second substrate in a thickness direction of the second substrate, the first sub-layer is closer to the mother board than the second sub-layer, the second sub-layer includes the at least one second connection pad, at least one second via is disposed in the second substrate, and a second connection pad in the at least one second connection pad is electrically connected to the first sub-layer through a second via in the at least one second via, the first sub-layer includes the at least one fan-out wiring; the second sub-layer further includes the at least one third connection pad; at least one fourth via is further disposed in the second substrate, and each third connection pad is connected to a fan-out wiring in the at least one fan-out wiring through a fourth via in the at least one fourth via; the at least one fourth via is in one-to-one correspondence with the at least one second via, and a fourth via in the at least one fourth via and a corresponding second via in the at least one second via are located on a same fan-out wiring;

in a case where the second wiring layer is disposed on a side of the second substrate away from the mother board, the daughter board further includes an insulating layer disposed on a side of the second wiring layer away from the second substrate, at least one sixth via is disposed in the insulating layer, and each sixth via exposes a portion of the second wiring layer that constitutes a second connection pad in the at least one second connection pad, the second wiring layer includes the at least one fan-out wiring; at least one fifth via is further disposed in the insulating layer, and each fifth via exposes a portion of the second wiring layer that constitutes a third connection pad in the at least one third connection pad; the at least one fifth via is in one-to-one correspondence with the at least one sixth via, and a fifth via in the at least one fifth via and a corresponding sixth via in the at least one sixth via are located on a same fan-out wiring.

7. The wiring board assembly according to claim 1, wherein the at least one first connection pad is disposed in the passive area, the daughter board is arranged close to the passive area, and an orthographic projection of the daughter board on the first substrate does not exceed edges of the first substrate.

8. The wiring board assembly according to claim 7, wherein the mother board has a shape of a rectangle; and the active area and the passive area are arranged in sequence in a first direction, and the first direction is a direction represented by a long side or a short side of the rectangle;

wherein in a case where the first direction is the direction represented by the long side of the rectangle, the at least one side wiring is disposed on a side of the wiring board assembly corresponding to the short side of the rectangle; in a case where the first direction is the direction represented by the short side of the rectangle, the at least one side wiring is disposed on a side of the wiring board assembly corresponding to the long side of the rectangle.

9. The wiring board assembly according to claim 8, wherein the at least one second connection pad is arranged close to the passive area; and the at least one first connection pad includes a plurality of first connection pads, and the at least one second connection pad includes a plurality of second connection pads; wherein the plurality of first connection pads are arranged in sequence in a second direction, and the plurality of second connection pads are arranged in sequence in the second direction; each first connection pad is in correspondence with a second connection pad in the plurality of second connection pads connected to this first connection pad in a thickness direction of the second substrate; wherein the second direction is perpendicular to the first direction.

10. The wiring board assembly according to claim 7, wherein the wiring board assembly further comprises a protective layer disposed on the at least one side wiring, and an orthographic projection of edges of the protective layer on the first substrate exceeds an orthographic projection of edges of the at least one side wiring on the first substrate.

11. The wiring board assembly according to claim 10, wherein a distance between an edge of the protective layer and a corresponding edge of an entirety of the at least one side wiring is greater than or equal to 20 microns.

12. The wiring board assembly according to claim 7, wherein the mother board has a shape of a rectangle; wherein in a case where the active area and the passive area are arranged in sequence in a first direction, and the first direction is a direction represented by a long side of the rectangle, the at least one side wiring is disposed on a side of the wiring board assembly corresponding to a short side of the rectangle, and there is a first gap between the orthographic projection, on the first substrate, of the edge of the daughter board proximate to the passive area and an edge of the first substrate corresponding to the short side of the rectangle and the edge of the daughter board; the wiring board assembly further comprises a first level difference filling layer, and the first level difference filling layer is disposed between the daughter board and the at least one side wiring, and is located in the first gap;

in a case where the active area and the passive area are arranged in sequence in the first direction, and the first direction is a direction represented by the short side of the rectangle, the at least one side wiring is disposed on a side of the wiring board assembly corresponding to the long side of the rectangle, and there is a second gap between the orthographic projection, on the first substrate, of the edge of the daughter board proximate to the passive area and an edge of the first substrate corresponding to the long side of the rectangle and the edge of the daughter board; the wiring board assembly further comprises a second level difference filling layer, and the second level difference filling layer is disposed between the daughter board and the at least one side wiring, and is located in the second gap.

13. The wiring board assembly according to claim 12, wherein in a case where the wiring board assembly comprises the first level difference filling layer, a surface of the first level difference filling layer opposite to the side of the wiring board assembly where the at least one side wiring is located is an arc-shaped surface;

in a case where the wiring board assembly comprises the second level difference filling layer, a surface of the second level difference filling layer opposite to the side of the wiring board assembly where the at least one side wiring is located is an arc-shaped surface.

14. The wiring board assembly according to claim 1, wherein a chamfer structure or a rounded corner structure is disposed at a position of the first substrate corresponding to a side of the wiring board assembly where the at least one side wiring is located;

and/or a thickness of the bonding layer is in a range of 8 microns to 15 microns, inclusive, and a thickness of the second substrate is in a range of 5 microns to 20 microns, inclusive.

15. The wiring board assembly according to claim 2, wherein in a case where the second wiring layer is disposed on the side of the second substrate proximate to the mother board, or is disposed on the side of the second substrate away from the mother board, a thickness of the second wiring layer is in a range of 0.6 microns to 2 microns, inclusive;

in a case where the second wiring layer includes the first sub-layer and the second sub-layer, a thickness of the first sub-layer and a thickness of the second sub-layer are each in a range of 0.6 microns to 2 microns, inclusive.

16. A functional backplane, comprising:

the wiring board assembly according to claim 1; and at least one electronic element; wherein the at least one electronic element is disposed on the wiring board assembly, and is electrically connected to the first wiring layer in the wiring board assembly.

17. A manufacturing method of a wiring board assembly, comprising:

manufacturing a mother board and a daughter board separately; wherein the mother board includes a first substrate and a first wiring layer formed on the first substrate, and the first wiring layer includes at least one first connection pad; the daughter board includes a second substrate and a second wiring layer formed on the second substrate, and the second wiring layer includes at least one second connection pad;

forming a bonding layer between the mother board and the daughter board to connect the mother board and the daughter board; wherein the daughter board is formed on a side of the first substrate away from the first wiring layer; and forming at least one side wiring on the mother board and the daughter board; wherein the at least one side wiring is connected, via a respective end thereof, to the at least one first connection pad in one-to-one correspondence, and the at least one side wiring is connected, via respective another end thereof, to the at least one second connection pad in one-to-one correspondence; wherein the mother board has an active area and a passive area located on a side of the active area;

and there is a gap between an orthographic projection, on the first substrate, of an edge of the daughter board proximate to the passive area and an edge of the first substrate proximate to the passive area.

18. The manufacturing method of the wiring board assembly according to claim 17, wherein the second substrate is a flexible substrate; and manufacturing the daughter board, includes:

forming a sacrificial layer on a third substrate;

forming the at least one second connection pad on the third substrate on which the sacrificial layer is formed;

forming a flexible film on the third substrate on which the at least one second connection pad is formed;

forming at least one second via in the flexible film; wherein each second via corresponds to a second connection pad in the at least one second connection pad;

forming a third wiring layer on the third substrate on which the at least one second via is formed; wherein each second connection pad is electrically connected to the third wiring layer through a second via in the at least one second via;

heating or irradiating the sacrificial layer with light to separate the second substrate and the at least one second connection pad from the third substrate, so as to obtain the daughter board.

19. The manufacturing method of the wiring board assembly according to claim 17, wherein the second substrate is a rigid substrate; and manufacturing the daughter board, includes:

forming the second wiring layer directly on the second substrate to obtain the daughter board.

20. The manufacturing method of the wiring board assembly according to claim 18, wherein a material of the bonding layer includes an adhesive;

before the sacrificial layer is heated or irradiated with light to separate the second substrate and the at least one second connection pad from the third substrate, manufacturing the daughter board further includes: sequentially forming a glue layer and a release layer on the third substrate on which the third wiring layer is formed; and after the sacrificial layer is heated or irradiated with light to separate the second substrate and the at least one second connection pad from the third substrate, the manufacturing method of the wiring board assembly further comprises: removing the release layer to expose the glue layer, so as to adhere the mother board to the daughter board by using the glue layer.

* * * * *